US012628694B2

(12) United States Patent
Hoo et al.

(10) Patent No.: US 12,628,694 B2
(45) Date of Patent: May 12, 2026

(54) INTEGRATED BARE DIE PACKAGE, AND RELATED FABRICATION METHODS

(71) Applicant: QUALCOMM Incorporated, San Diego, CA (US)

(72) Inventors: Yeng Kwan Hoo, Unterhaching (DE); Anna Katharina Krefft, Haar (DE); Emre Topal, Munich (DE)

(73) Assignee: QUALCOMM Incorporated, San Diego, CA (US)

( * ) Notice: Subject to any disclaimer, the term of this patent is extended or adjusted under 35 U.S.C. 154(b) by 586 days.

(21) Appl. No.: 18/066,448

(22) Filed: Dec. 15, 2022

(65) Prior Publication Data

US 2024/0203938 A1 Jun. 20, 2024

(51) Int. Cl.
| | |
|---|---|
| *H01L 25/065* | (2023.01) |
| *H10W 70/60* | (2026.01) |
| *H10W 70/685* | (2026.01) |
| *H10W 74/01* | (2026.01) |
| *H10W 90/00* | (2026.01) |

(52) U.S. Cl.
CPC .......... *H10W 90/00* (2026.01); *H10W 70/611* (2026.01); *H10W 70/685* (2026.01); *H10W 74/01* (2026.01); *H10W 90/701* (2026.01); *H10W 90/724* (2026.01)

(58) Field of Classification Search
None
See application file for complete search history.

(56) References Cited

U.S. PATENT DOCUMENTS

| | | | | |
|---|---|---|---|---|
| 11,309,352 B2 * | 4/2022 | Goktepeli | ................ | H03H 9/64 |
| 2017/0126201 A1 * | 5/2017 | Iwamoto | .............. | H03H 9/0552 |
| 2017/0126234 A1 | 5/2017 | Isohata et al. | | |
| 2019/0273116 A1 * | 9/2019 | Goktepeli | ................ | H03H 9/64 |
| 2020/0112297 A1 | 4/2020 | Nomiya | | |

OTHER PUBLICATIONS

Invitation to Pay Additional Fees and Partial International Search for International Patent Application No. PCT/US2023/082013, mailed Apr. 17, 2024, 12 pages.
International Search Report and Written Opinion for International Patent Application No. PCT/US2023/082013, mailed Jun. 7, 2024, 22 pages.

* cited by examiner

*Primary Examiner* — Long Pham
(74) *Attorney, Agent, or Firm* — Withrow & Terranova, PLLC

(57) ABSTRACT
Integrated bare die packages, and related fabrication methods are disclosed. To provide for the integration of a bare die filter into the bare die package while maintaining an acoustic cavity for the bare die filter and conserving package size, the bare die filter is vertically-integrated with a second component (e.g., another die, a second bare die filter, a passive electrical device(s)). In examples, the bare die filter is vertically-integrated with the second component in a second direction (e.g., vertical direction) orthogonal to the first direction on a first side of a package substrate of the bare die package. The bare die filter and the second component each intersect a common plane in the second direction. In this manner, the expansion in size of the bare die package through the integrated of bare die filter is minimized, while also maintaining the acoustic cavity of the bare die filter.

18 Claims, 16 Drawing Sheets

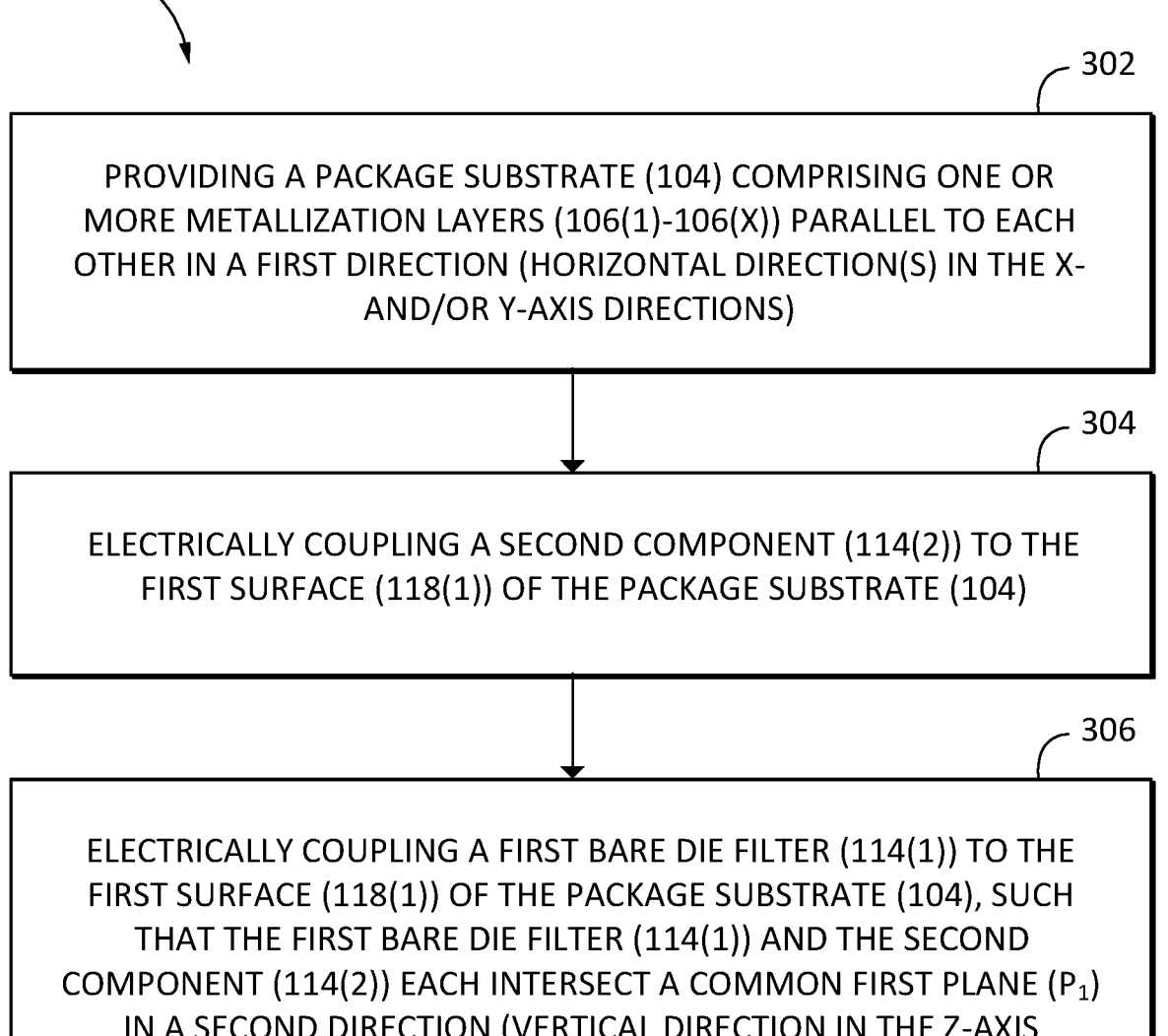

300

302

PROVIDING A PACKAGE SUBSTRATE (104) COMPRISING ONE OR MORE METALLIZATION LAYERS (106(1)-106(X)) PARALLEL TO EACH OTHER IN A FIRST DIRECTION (HORIZONTAL DIRECTION(S) IN THE X- AND/OR Y-AXIS DIRECTIONS)

304

ELECTRICALLY COUPLING A SECOND COMPONENT (114(2)) TO THE FIRST SURFACE (118(1)) OF THE PACKAGE SUBSTRATE (104)

306

ELECTRICALLY COUPLING A FIRST BARE DIE FILTER (114(1)) TO THE FIRST SURFACE (118(1)) OF THE PACKAGE SUBSTRATE (104), SUCH THAT THE FIRST BARE DIE FILTER (114(1)) AND THE SECOND COMPONENT (114(2)) EACH INTERSECT A COMMON FIRST PLANE ($P_1$) IN A SECOND DIRECTION (VERTICAL DIRECTION IN THE Z-AXIS DIRECTION) ORTHOGONAL TO THE FIRST DIRECTION (HORIZONTAL DIRECTION IN THE X- AND/OR Y-AXIS DIRECTIONS)

FIG.3

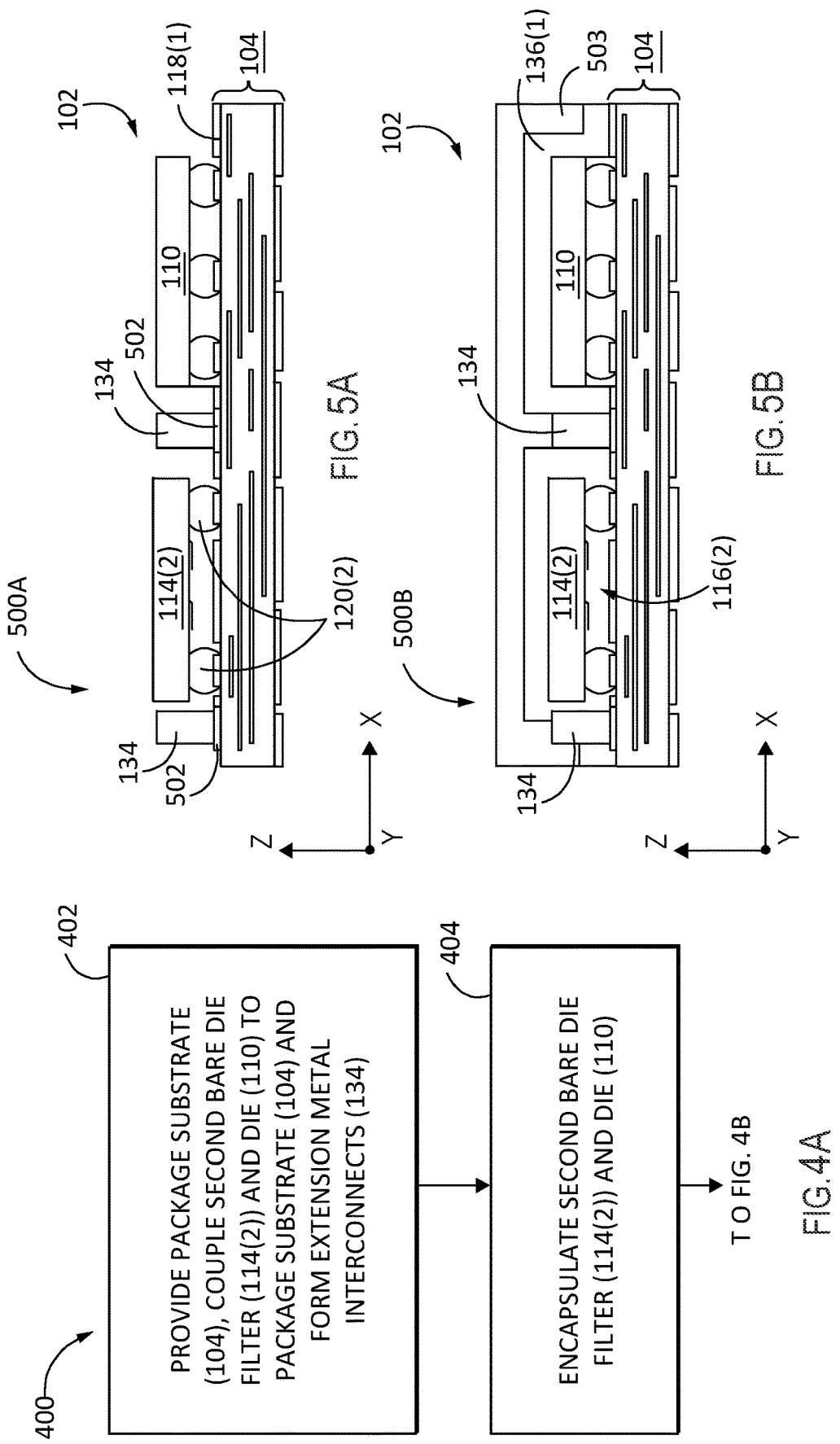

FROM FIG. 4A

GRIND DOWN FIRST AND SECOND OVERMOLD LAYERS (136(1), 503)) TO PREPARE FIRST BARE DIE FILTER (114(1)) TO BE COUPLED TO EXTENSION METAL INTERCONNECTS (134)

406

FORM OPTIONAL RDL (504)

FROM FIG. 4B

COUPLE FIRST METAL INTERCONNECTS (120(1)) OF FIRST BARE DIE FILTER (114(1)) TO EXTENSION METAL INTERCONNECTS (134)

410

FORM SECOND AND THIRD OVERMOLD LAYERS (136(2), 136(3)) ON FIRST BARE DIE FILTER (114(1)) AND FIRST OVERMOLD LAYER (136(1))

412

400

INTEGRATED BARE DIE PACKAGE, AND RELATED FABRICATION METHODS

BACKGROUND

I. Field of the Disclosure

The field of the disclosure relates to integrated circuit (IC) packages that incorporate die filters, including bare die filter module packages (BDMPs) and systems-in-a-package (SiPs).

II. Background

Mobile wireless device manufacturers pack ever-increasing capabilities into hand-held sized packages. Increasing capability means that more electronic components must fit into the package. This trend drives a size reduction of electronic components used for radio-frequency (RF) signal processing. A challenge to miniaturizing electronic components is finding a way to provide the same function in a physically smaller electronic device. Another challenge to miniaturizing electronic components is created by a physically smaller device dissipating the same or similar amount of power, leading to the same or similar heat generation. Heat generated within a physically smaller device leads to higher operating temperatures in a smaller package, which increases the potential to affect device performance and its life span. Thus, there is a desire to find ways for more effectively dissipating heat when reducing the device size.

One device that has been employed in RF signal processing circuits (e.g., RF front end (RFFE) circuits) provided in smaller electronic devices for signal filtering is an acoustic wave (AW) filter, such as a surface AW (SAW) filter, or bulk AW (BAW) filter. The AW filter removes or reduces the energy in one or more bands of frequencies from an input analog signal. An AW filter filters frequencies by transforming electromagnetic wave propagation into mechanical wave propagation on the surface of a substrate material. AW filters can be implemented as a die filter in a systems-in-a-package (SiPs) and bare die module packages (BDMPs). In a SiP, a filter circuit can be incorporated as a die filter that is coupled to a package substrate like an integrated circuit (IC) die. The die filter is encapsulated in the SiP. In a BDMP, a die filter is coupled to a package substrate and is also encapsulated, but an air cavity as an acoustic cavity is preserved between the die filter and the package substrate free of encapsulation material. SiP and BDMP technology has been significant in the reduction of mobile device sizes. However, there is continued need to decrease SiP and BDMP size, especially when integrated into mobile devices. Double-sided BDMPs have been developed where a filter die(s) and IC die(s) are coupled on both sides of a package substrate to avoid or mitigate increase in vertical height of the packages. However, package design rules may limit the integration dies on both sides of a package substrate to provide a double-sided SiP or BDMP.

SUMMARY OF THE DISCLOSURE

Aspects disclosed herein include an integrated bare die package. Related fabrication methods are also disclosed. A bare die package is an integrated circuit (IC) package that includes at least one bare semiconductor die ("die"). A bare die is a die in an IC package that has an area free of encapsulation between a side of the die and a coupled surface (e.g., a surface of a package substrate) adjacent to the die side. The area that is free of encapsulation between the die and the coupled surface provides an air cavity between the die and the coupled surface. For example, a bare die package may include a bare die filter that is a cavity filter that has an area free of encapsulation between an active side of a filter die and a coupled surface to maintain an air cavity that acts a cavity resonator to filter and pass RF signals at particular frequencies. The bare die package includes a package substrate that includes one or more metallization layers disposed in parallel with each other in a first direction (e.g., horizontal direction). The metallization layers include metal interconnects to provide external signal routing to one or more included semiconductor dies ("dies") and/or between dies. The die(s) is electrically coupled to the package substrate. In exemplary aspects, to provide for the integration of a bare die filter into the bare die package such that the acoustic cavity for the bare die filter is maintained and package size is conserved, the bare die filter is vertically-integrated with a second component (e.g., another die, a second bare die filter, a passive electrical device(s)). The bare die filter is vertically-integrated with the second component in a second direction (e.g., vertical direction) orthogonal to the first direction on a first surface of the package substrate. In this regard, the bare die filter is coupled to a first surface of the package substrate through metal interconnects coupled to package substrate. The second component is also coupled to the first surface of the package substrate through metal interconnects coupled to package substrate. The bare die filter and the second component each intersect a common plane in the second direction (e.g., vertical direction) such that the bare die filter and the second component are at least partially overlapping with regard to each other in the second direction (e.g., vertical direction) when coupled the first surface of the package substrate.

In this manner, the expansion in size of the bare die package through the integration of a bare die filter is minimized, while also maintaining the acoustic cavity of the bare die filter. The vertical integration of the bare die filter with the second component can also optimize and reduce the footprint size of the bare die package in the first directions (horizontal directions in the X-axis and Y-axis directions) while optimizing input/output in count for the bare die package through metal interconnects than can be formed and coupled to the metallization layer of the package substrate as part of the bare die package. As an example, if instead, the bare die filter was disposed on an opposite side of the package substrate from the second component as a double-sided package, this may require fabrication techniques that are beyond process limitations for fabricating the bare die package. The process may require a sufficient space to be provided between the metal interconnects of the bare die package standing off the package substrate from a coupled circuit board. As another example, the space created by the metal interconnects of the bare die package standing off the package substrate from a coupled circuit board may be needed for a higher density of input/output (I/O) pin count for the bare die package.

In one example, the second component may be disposed below the bare die filter in the second direction (e.g., vertical direction) such that the second component is disposed between the bare die filter and the first surface of the package substrate in the second direction (e.g., vertical direction). In this scenario, to provide for the bare die filter to be vertically-integrated to the second component such that an acoustic cavity is provided for the bare die filter, metal extension interconnects (e.g., metal posts, wire bonds) are disposed adjacent to the second component and coupled to the first surface of the package substrate. These metal extension interconnects extend in the second direction (e.g., vertical direction) adjacent to the second component. The metal interconnects of the bare die filter are coupled either directly or indirectly (e.g., through a redistribution layer(s) (RDL(s))) to the metal extension interconnects such that the bare die filter is supported and the filter die of the bare die filter is stood off above the second component in the second direction (e.g., vertical direction) such that an acoustic cavity is provided for the bare die filter. In this manner, as an example, the filter die of the bare die filter may be larger in the first direction (e.g., horizontal direction) than the second component so that the filter die can be coupled to the metal extension interconnects outside of the area of the second component. The acoustic cavity for the bare die filter is maintained by not disposing a mold material in the acoustic cavity between the bare die filter in the fabrication of the bare die package.

In another example, the bare die filter may be disposed below the second component in the second direction (e.g., vertical direction) such that the bare die filter is disposed between the second component and the first surface of the package substrate in the second direction (e.g., vertical direction). An acoustic cavity is provided for the bare die filter by the filter die of the bare die filter being coupled through its metal interconnects to the first surface of the package substrate, such that the filter die is supported and stood off above the first surface of the package substrate in the second direction (e.g., vertical direction). In this second scenario, to provide for the second component to be vertically-integrated to the bare die filter, metal extension interconnects (e.g., posts, wire bonds) are disposed adjacent to the bare die filter and coupled to the first surface of the package substrate. These metal extension interconnects extend in the second direction (e.g., vertical direction) adjacent to the bare die filter. The metal interconnects of the second component are coupled either directly or indirectly (e.g., through a redistribution layer(s) (RDL(s))) to the metal extension interconnects such that the second component is supported and stood off above the bare die filter in the second direction (e.g., vertical direction). In this manner, as an example, the second component may be larger in the first direction (e.g., horizontal direction) than the bare die filter so that the second component can be coupled to the metal extension interconnects outside of the area of the bare die filter. A mold material can be disposed around and/or between the second component and the bare die filter in the fabrication of the bare die package to protect and isolate the second component.

Note that in other examples, a bare die package can be provided in which multiple bare die filters are provided and vertically integrated with other components on the same side of the package substrate. The multiple bare die filters can be vertically integrated with other components. The multiple bare die filters can also be vertically integrated to each other. The bare die package can include or more levels in the second direction (e.g., vertical direction) of vertically integrated components that include at least one bare die filter.

In this regard, in one exemplary aspect, a bare die package is provided. The bare die package comprises a package substrate comprising one or more metallization layers parallel to each other in a first direction. The bare die package also comprises a first bare die filter coupled to a first surface of the package substrate. The bare die package also comprises a second component coupled to the first surface of the package substrate. The first bare die filter and the second component each intersect a common first plane in a second direction orthogonal to the first direction.

In another exemplary aspect, a method of fabricating a bare die package, is provided. The method comprises providing a package substrate comprising one or more metallization layers parallel to each other in a first direction. The method also comprises electrically coupling a second component to the first surface of the package substrate. The method also comprises electrically coupling a first bare die filter to a first surface of the package substrate, such that the first bare die filter and the second component each intersect a common first plane in a second direction orthogonal to the first direction

BRIEF DESCRIPTION OF THE FIGURES

FIG. 3 is a flowchart illustrating an exemplary fabrication process of fabricating an integrated bare die package that includes a bare die filter vertically-integrated with a second component, including but not limited to the integrated bare die package in FIGS. 1A and 1B;

FIGS. 4A-4C is a flowchart illustrating another exemplary process of fabricating the integrated bare die package in FIGS. 1A and 1B by forming extension metal interconnects of metal posts on a package substrate to support and provide electrical connections for the vertically-integrated first bare die filter;

FIGS. 5A-5F illustrate exemplary fabrication stages according to the exemplary fabrication process in FIGS. 4A-4C;

DETAILED DESCRIPTION

Figure 1A:
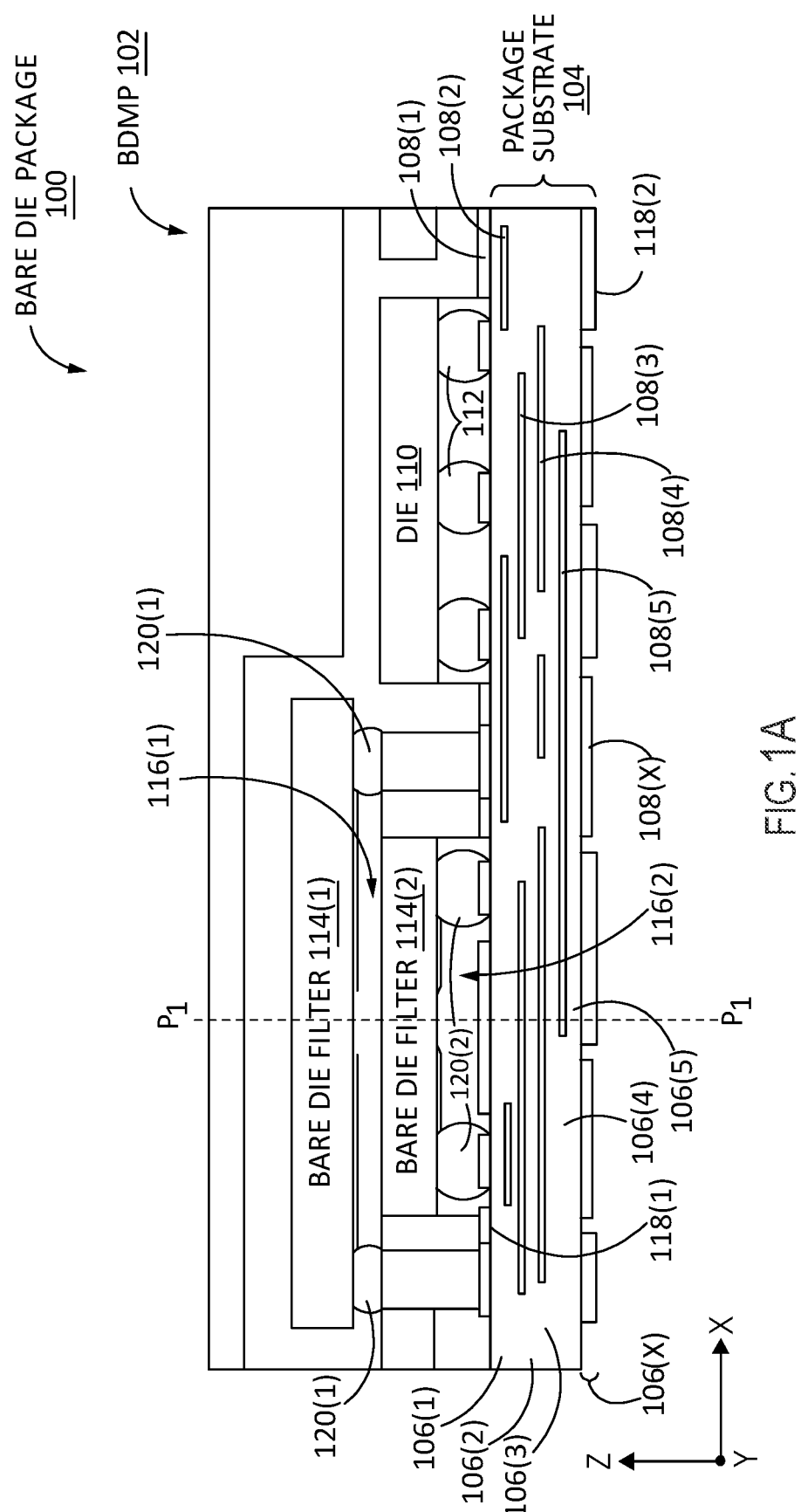
FIGS. 1A and 1B are side views of an exemplary integrated bare die package in the form of a bare die module package (BDMP) that includes a first bare die filter vertically-integrated with a second component that is a second bare die filter in this example.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include an integrated bare die package. Related fabrication methods are also disclosed. A bare die package is an integrated circuit (IC) package that includes at least one bare semiconductor die ("die"). A bare die is a die in an IC package that has an area free of encapsulation between a side of the die and a coupled surface (e.g., a surface of a package substrate) adjacent to the die side. The area that is free of encapsulation between the die and the coupled surface provides an air cavity between the die and the coupled surface. For example, a bare die package may include a bare die filter that is a cavity filter that has an area free of encapsulation between an active side of a filter die and a coupled surface to maintain an air cavity that acts a cavity resonator to filter and pass RF signals at particular frequencies. The bare die package includes a package substrate that includes one or more metallization layers disposed in parallel with each other in a first direction (e.g., horizontal direction). The metallization layers include metal interconnects to provide external signal routing to one or more included semiconductor dies ("dies") and/or between dies. The die(s) is electrically coupled to the package substrate. In exemplary aspects, to provide for the integration of a bare die filter into the bare die package such that the acoustic cavity for the bare die filter is maintained and package size is conserved, the bare die filter is vertically-integrated with a second component (e.g., another die, a second bare die filter, a passive electrical device(s)). The bare die filter is vertically-integrated with the second component in a second direction (e.g., vertical direction) orthogonal to the first direction on a first surface of the package substrate. In this regard, the bare die filter is coupled to the first surface of the package substrate through metal interconnects coupled to package substrate. The second component is also coupled to the first surface of the package substrate through metal interconnects coupled to package substrate. The bare die filter and the second component each intersect a common plane in the second direction (e.g., vertical direction) such that the bare die filter and the second component are at least partially overlapping with regard to each other in the second direction (e.g., vertical direction).

In this manner, the expansion in size of the bare die package through the integration of a bare die filter is minimized, while also maintaining the acoustic cavity of the bare die filter. The vertical integration of the bare die filter to the second component can also optimize and reduce the footprint size of the bare die package in the first directions (horizontal directions in the X-axis and Y-axis directions) while optimizing input/output in count for the bare die package through metal interconnects than can be formed and coupled to the metallization layer of the package substrate as part of the bare die package. As an example, if instead, the bare die filter was disposed on an opposite side of the package substrate from the second component as a double-sided package, this may require fabrication techniques that are beyond process limitations for fabricating the bare die package. The process may require a sufficient space to be provided between the metal interconnects of the bare die package standing off the package substrate from a coupled circuit board. As another example, the space created by the metal interconnects of the bare die package standing off the package substrate from a coupled circuit board may be needed for a higher density of input/output (I/O) pin count for the bare die package.

Figure 1B:
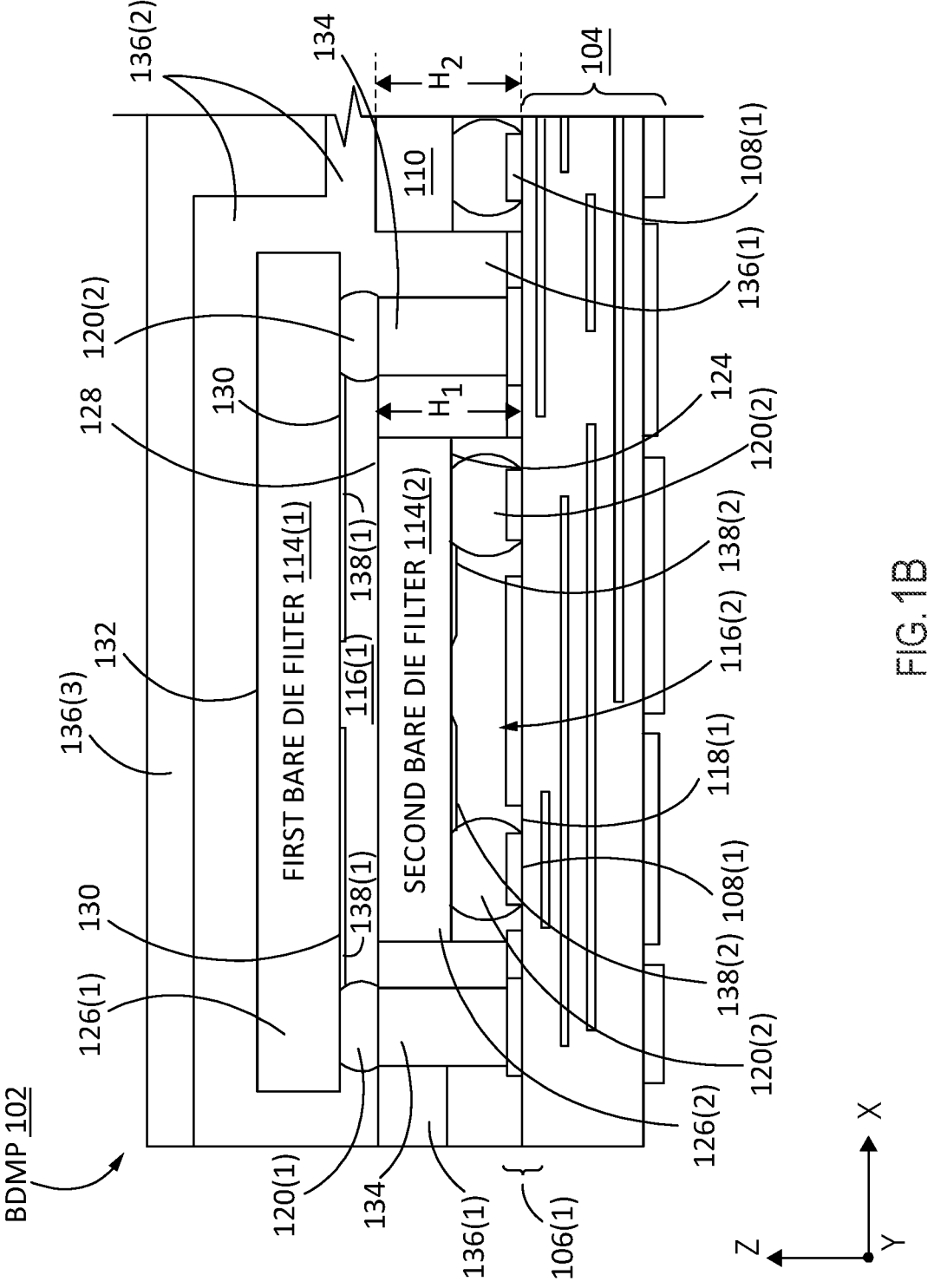

In this regard, FIGS. 1A and 1B are side views of an exemplary integrated bare die package 100 in the form of a bare die module package (BDMP) 102. A bare die package, including the BDMP 102 in FIGS. 1A and 1B, is a die package that includes at least one die that has an area free of encapsulation between a die side and a coupled surface (e.g., a surface of a package substrate).) The area that is free of encapsulation between the die side and the coupled surface provides an air cavity between the die side and the coupled surface. For example, a bare die package may include a bare die filter that is a cavity filter that is free of encapsulation between an active side of a filter die and a coupled surface to maintain an air cavity that acts a cavity resonator to filter and pass RF signals at particular frequencies. Examples of bare die packages are described below, with the BDMP 102 in FIGS. 1A and 1B being an example of a bare die package that is now described in more detail.

In this example, as discussed in more detail below and shown in FIG. 1A, the BDMP 102 includes a package substrate 104 that includes one or more metallization layers 106(1)-106(X) disposed in parallel with each other in a first direction (horizontal directions in the X- and/or Y-axis directions). The metallization layers 106(1)-106(X) include respective metal interconnects 108(1)-108(X) (e.g., metal traces, metal lines) to provide external signal routing to a semiconductor die ("die") 110. The die 110 is electrically coupled to the package substrate 104 through one or more metal interconnects 112 (e.g., solder balls, ball grid array (BGA) interconnects). To provide for the integration of a first bare die filter 114(1) into the BDMP 102 such that an acoustic air cavity 116(1) for the first bare die filter 114(1) is maintained and package size of the BDMP 102 is conserved, the first bare die filter 114(1) is vertically-integrated with a second component (which is a second bare die filter 114(2) in this example). The first bare die filter 114(1) is vertically-integrated with the second bare filter 114(2) in a second direction (vertical direction in the Z-axis direction orthogonal to the first direction (horizontal directions in the X- and/or Y-axis directions)). As an example, the first and/or second bare die filters 114(1), 114(2) may be coupled to the die 110 through the package substrate 104 such that the first and/or second bare die filters 114(1), 114(2) can filter signals processed by the die 110. For example, the die 110 may be a radio-frequency integrated circuit (RFIC) die that includes RF front-end and/or transceiver circuits. As discussed in more detail below, the second component in the first bare die filter 114(1) is vertically integrated with can be other components, such as a die or passive electrical components. In this example, the first bare die filter 114(1) is both electrically and physically coupled to a first surface 118(1) of the package substrate 104 through first metal interconnects 120(1) electrically coupled to the package substrate 104. The second component in the form of the second bare die filter 114(2) is also electrically coupled to the first surface 118(1) of the package substrate 104 through second metal interconnects 120(2) coupled to the first surface 118(1) of the package substrate 104. The first bare die filter 114(1) and the second bare die filter 114(2) each intersect a common plane $P_1$ that extends in second direction (vertical direction in the Z-axis direction) such that the first bare die filter 114(1) and the second bare die filter 114(2) are at least partially overlapping with regard to each other in the second direction (vertical direction in the Z-axis direction) as coupled to the first surface 118(1) of the package substrate 104. In this example, the first bare die filter 114(1) fully overlaps the second bare die filter 114(2) in the second direction (vertical direction in the Z-axis direction).

In this manner, the expansion in size of the BDMP 102 through the vertically-integrated first bare die filter 114(1) with the second bare die filter 114(2) is minimized, while also maintaining the acoustic air cavities 116(1), 116(2) of the first and second bare die filters 114(1), 114(2) to be maintained and free of encapsulation material. In this example, the first and second bare die filters 114(1), 114(2) are acoustic filters that require air cavities 116(1), 116(2) to be provided and maintained to perform acoustic filtering. The vertical integration of the first bare die filter 114(1) to the second bare die filter 114(2) can also optimize and reduce the footprint size of the BDMP 102 in the first directions (horizontal directions in the X-axis and Y-axis directions) while optimizing input/output in count for the BDMP 102 through external interconnects than can be formed and coupled to the metallization layer 106(X) of the package substrate 104 as part of the BDMP 102. As an example, if instead, the first bare die filter 114(1) was disposed on and coupled to an opposite, second surface 118(2) of the package substrate 104 separate from the second bare die filter 114(2) such that the BDMP 102 was a double-sided package, this may violate package design rules that govern the available space created by external metal interconnects of the BDMP 102 standing off of the second surface 118(2) of the package substrate 104 from a coupled circuit board. As another example, the space created by the external metal interconnects of the BDMP 102 standing off the package substrate 104 from a coupled circuit board may be needed for a higher density of input/output (I/O) pin count for the BDMP 102.

FIG. 1B is a close-up side view of the BDMP 102 in FIG. 1A to illustrate additional exemplary details. In this regard, as shown in FIG. 1B, the second bare die filter 114(2) as the second component is adjacent to the first surface 118(1) of the package substrate 104. In this example, the second bare die filter 114(2) is physically and electrically coupled to the first surface 118(1) of the package substrate 104 by its second metal interconnects 120(2) being coupled to metal interconnects 108(1) in the upper metallization layer 106(1) adjacent to the first surface 118(1) of the package substrate 104. In this example, the second bare die filter 114(2), by being adjacent to the first surface 118(1) of the package substrate 104, is disposed between the first surface 118(1) of the package substrate 104 and the first bare die filter 114(1) in the second direction (vertical direction in the Z-axis direction). In this example, a bottom, fourth surface 124 of a second filter die 126(2) of the second bare die filter 114(2) is adjacent to the first surface 118(1) of the package substrate 104. The second filter die 126(2) is a die that includes electrical and/or mechanical components for the second bare die filter 114(2). A top, fifth surface 128 of the second filter die 126(2) of the second bare die filter 114(2) opposite the fourth, bottom surface 124 in the second direction (vertical direction in Z-axis direction), is adjacent to a bottom, second surface 130 of a first filter die 126(1) of the first bare die filter 114(1). The first filter die 126(1) is a die that includes electrical and/or mechanical components for the first bare die filter 114(1). The first filter die 126(1) of the first bare die filter 114(1) also includes a top, third surface 132 opposite the bottom, second surface 130 of the first filter die 126(1) in the second direction (vertical direction in Z-axis direction). The bottom, second surface 130 of the first filter die 126(1) is adjacent to the top, fifth surface 128 of the second filter die 126(2) in this example.

With continuing reference to FIG. 1B, the second air cavity 116(2) of the second bare die filter 114(2) is formed in the space between the bottom, fourth surface 124 of the second filter die 126(2) of the second bare die filter 114(2) and the first surface 118(1) of the package substrate 104. The second metal interconnects 120(2) provide a stand-off between the bottom, fourth surface 124 of the second filter die 126(2) of the second bare die filter 114(2) and the first surface 118(1) of the package substrate 104. As discussed in more detail below, the BDMP 102 is fabricated such that the second air cavity 116(2) is maintained free of underfill material, such as mold layer material, to preserve the integrity of the second air cavity 116(2) for the performance of the second bare die filter 114(2).

Similarly, as shown in FIG. 1B, the first air cavity 116(1) of the first bare die filter 114(1) is formed in the space between the bottom, second surface 130 of the first filter die 126(1) of the first bare die filter 114(1) and the top, fifth surface 128 of the second filter die 126(2) of the second bare die filter 114(2). The first metal interconnects 120(1) provide a stand-off between the bottom, third surface 130 of the first filter die 126(1) of the first bare die filter 114(1) and extension metal interconnects 134 coupled to the first metal interconnects 120(1). Extension metal interconnects are metal interconnects (e.g., vias, metal posts) that extend the coupling of a component to a package substrate. In the example of FIGS. 1A and 1B, the extension metal interconnects are metal interconnects (e.g., vias, metal posts) that extend the coupling of the first bare die filter 114(1) to the package substrate 104. The first metal interconnects 120(1) are coupled to the extension metal interconnects 134 to provide for the first metal interconnects 120(1) to be electrically coupled to the package substrate 104. In this example, the first metal interconnects 120(1) are electrically coupled to metal interconnects 108(1) in the upper metallization layer 106(1) of the package substrate 104 at the first surface 118(1) of the package substrate 104 through coupling to the extension metal interconnects 134. The first metal interconnects 120(1) provide a stand-off between the bottom, second surface 130 of the first filter die 126(1) of the first bare die filter 114(1) and the top, fifth surface 128 of the second bare die filter 114(2). As discussed in more detail below, the BDMP 102 is fabricated such that the first air cavity 116(1) is maintained free of underfill material, such as mold layer material, to preserve the integrity of the second air cavity 116(2) for the performance of the first bare die filter 114(1).

In this example, to couple the first bare die filter 114(1), which is vertically-integrated above the second bare die filter 114(2), to the package substrate 104, the BDMP 102 also includes plurality of extension metal interconnects 134 of which two (2) extension metal interconnects 134 are shown in FIG. 1B. For example, the extension metal interconnects 134 are metal interconnects that are conductive and that are made from a metal material, such as copper. The extension metal interconnects 134 may be metal posts as shown in FIG. 1B, or alternatively may be wire bonds as discussed in more detail below. The extension metal interconnects 134 in this example are disposed on the outside of and adjacent to the second bare die filter 114(2) in the first directions (horizontal directions in the X- and/or Y-axis directions) so that the extension metal interconnects 134 do not interfere with the second bare die filter 114(2). The extension metal interconnects 134 "extend" in the second direction (vertical direction in Z-axis direction) up to the first bare die filter 114(1). In this example, the extension metal interconnects 134 extend in the second direction (vertical direction in the Z-axis direction) to a second height $H_2$ first surface 118(1) of the package substrate 104 that is equal to or greater than a first height $H_1$ of the top, fifth surface 128 of the second filter die 126(2) to the first surface 118(1) of the package substrate 104. The first metal interconnects 120(1) of the first bare die filter 114(1) are coupled to respective extension metal interconnects 134 to not only support the first bare die filter 114(1) being vertically integrated above the second bare die filter 114(2), but also to provide a conductive coupling path between the first bare die filter 114(1) and the package substrate 104.

Also, in the BDMP 102, several overmold layers are provided in the BDMP 102 to protect and isolate the first and second bare die filters 114(1), 114(2) and the die 110. In this regard, as shown FIG. 1B, a first overmold layer 136(1) is disposed adjacent to the sides of the second bare die filter 114(2) and the die 110. As described in more detail below, the first overmold layer 136(1) may have originally been disposed also on and above the top, fifth surface 128 of the second filter die 126(2) of the second bare die filter 114(2), but then grinded down to the fifth surface 128 of the second filter die 126(2) during fabrication to provide for the vertical integration of the first bare die filter 114(1). A second overmold layer 136(2) is disposed adjacent to the sides of the first bare die filter 114(1) and adjacent to and on the top, third surface 132 of the first filter die 126(1) of the first bare die filter 114(1). In this example, as shown in FIG. 1B, the second overmold layer 136(2) is also disposed adjacent and/or on the die 110 in the BDMP 102, because another component is not vertically integrated above the die 110 in this example. Thus, when the second overmold layer 136(2) is also disposed adjacent or on the top, third surface 132 of the first filter die 126(1) of the first bare die filter 114(1), the second overmold layer 136(2) will also be disposed adjacent and/or on the die 110. A final, third overmold layer 136(3) may be disposed over the second overmold layer 136(2) to fully encapsulate the BDMP 102. Optionally, overmold layer 136(2) may include two (2) combined layers of overmold material (e.g., overmold sheet layers) instead of providing a third overmold layer 136(3).

Also, in this example, to provide flexibility in providing routing paths between the first and second bare die filters 114(1), 114(2) and the package substrate 104, redistribution layers (RDLs) can also be formed in the BDMP 102. A RDL is a metal layer on that makes metal interconnects available in other locations, for better access to the metal interconnects where necessary. In this regard, as shown in FIG. 1B, one or more first RDLs 138(1) can be formed on or adjacent to the bottom, second surface 130 of the first filter die 126(1) of the first bare die filter 114(1) to redistribute connections between the first metal interconnects 120(1) and the first filter die 126(1). Similarly, one or more second RDLs 138(2) can be formed on or adjacent to the bottom, fourth surface 124 of the second filter die 126(2) of the second bare die filter 114(2) to redistribute connections between the second metal interconnects 120(2) and the second filter die 126(2).

In this example of the BDMP 102 in FIG. 1, as a non-limiting example, the BDMP 102 is not a stacked die, but the integration of the first bare die filter 114(1) is done on the BDMP 102. The first bare die filter 114(1) has a direct electrical coupling (through the extension metal interconnects 134) to the package substrate 104, as opposed to, for example, die stacking where a top die may have to use through silicon vias (TSVs) through a bottom die. This coupling of the first bare die filter 114(1) also provides a standoff of the first bare die filter 114(1) from the second bare die filter 114(2) underneath to form the air cavity 116(1). Vertical integration of the first bare die filter 114(1) may be less complicated and performed at the fabrication level of the BDMP 102 rather than through a separate bonding process. A die stacking process may be more complex.

Figure 2:
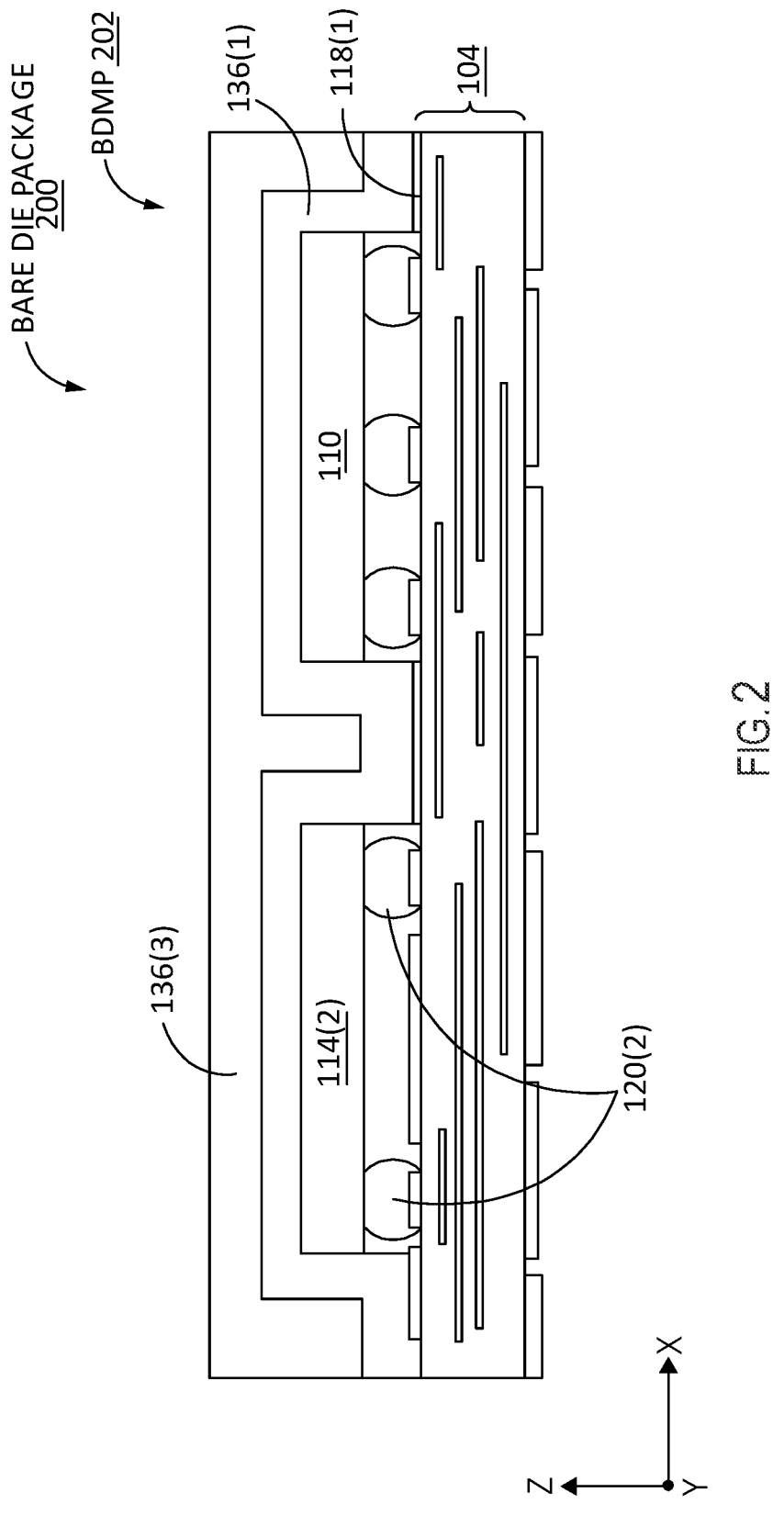
FIG. 2 is a side view of another exemplary bare die package; that does not have a first bare die filter vertically-integrated with a second component.

FIG. 2 is a side view of another exemplary bare die package 200 in the form of a BDMP 202 that does not have a bare die filter vertically-integrated with a second component, like provided in the BDMP 102 in FIGS. 1A and 1B for comparison purposes. Common components between the BDMP 102 in FIGS. 1A and 1B and the BDMP 202 in FIG. 2 are shown with common element numbers. As shown in FIG. 2, only the second bare die filter 114(2) and die 110 are included in the BDMP 202 adjacent to the first surface 118(1) of the package substrate 104. The first and third overmold layers 136(1), 136(3) are disposed adjacent to the second bare die filter 114(2) and die 110 without an intermediate second overmold layer 136(2), like provided in the BDMP 102 in FIGS. 1A and 1B in this example, because there is not a separate, vertically-integrated bare die filter included in the BDMP 202 in FIG. 2.

FIG. 3 is a flowchart illustrating an exemplary fabrication process 300 of fabricating an integrated bare die package that includes a bare die filter vertically-integrated with a second component, including but not limited to the bare die package 200/BDMP 102 in FIGS. 1A and 1B. The fabrication process 300 in FIG. 3 is described with regard to the BDMP 102 in FIGS. 1A and 1B. Note however that the fabrication process 300 in FIG. 3 can also be employed to fabricate other integrated bare die packages that include a bare die filter vertically-integrated with a second component.

In this regard, as shown in FIG. 3, a first exemplary step in the fabrication process 300 in this example is providing a package substrate 104 comprising one or more metallization layers 106(1)-106(X) parallel to each other in a first direction (horizontal direction(s) in the X- and/or Y-axis directions) (block 302 in FIG. 3). A next exemplary step in the fabrication process 300 is electrically coupling a second component 114(2) to the first surface 118(1) of the package substrate 104 (block 304 in FIG. 3). A next exemplary step in the fabrication process 300 is electrically coupling a first bare die filter 114(1) to the first surface 118(1) of the package substrate 104, such that the first bare die filter 114(1) and the second component 114(2) each intersect a common first plane P₁ in a second direction (vertical direction in the Z-axis direction) orthogonal to the first direction (horizontal direction in the X- and/or Y-axis directions) (block 306 in FIG. 3).

Figures 4B, 5C, 5D:
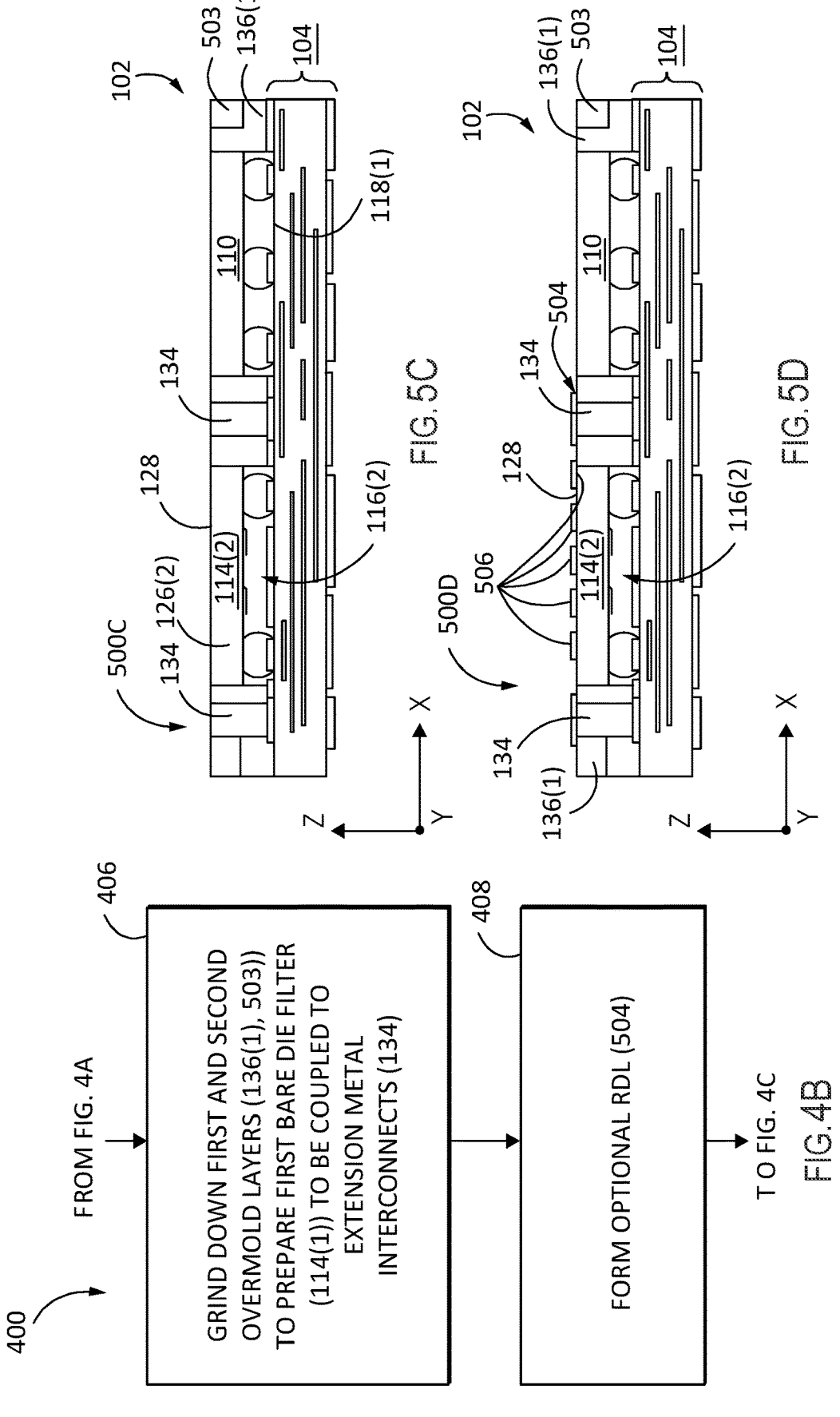
Figures 4C, 5E, 5F:
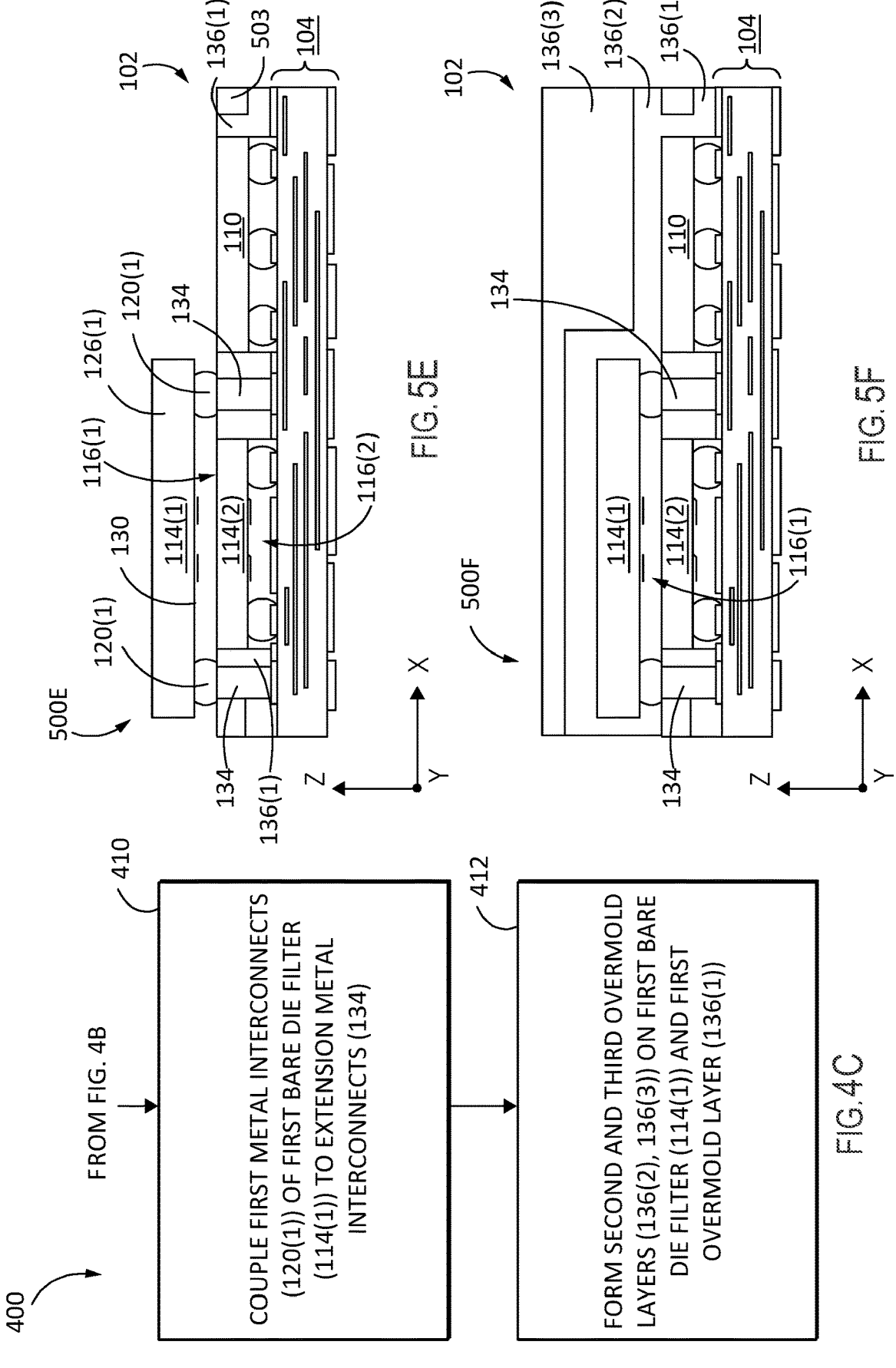

An integrated bare die package that includes a bare die filter vertically-integrated with a second component, including, but not limited, to the bare die package 100 in FIGS. 1A and 1B, can be fabricated in other fabrication processes. For example, FIGS. 4A-4C is a flowchart illustrating another exemplary fabrication process 400 of fabricating an integrated bare die package by forming the extension metal interconnects of metal posts on a package substrate to support and provide electrical connections for the vertically-integrated first bare die filter. FIGS. 5A-5F illustrate exemplary fabrication stages 500A-500F according to the exemplary fabrication process 400 in FIGS. 4A-4C. The fabrication process 400 in FIGS. 4A-4C is discussed below with regard to fabricating the integrated bare die package 100 ("bare die package 100") in FIGS. 1A and 1B by forming the extension metal interconnects 134 of metal posts on the package substrate 104 to support and provide electrical connections for the vertically-integrated first bare die filter 114(1). However, note that fabrication process 400 is not limited to fabricating the bare die package 100 in FIGS. 1A and 1B.

In this regard, as illustrated in the exemplary fabrication stage 500A in FIG. 5A, an exemplary step in the fabrication process 400 can be to provide the package substrate 104 and to couple the second bare die filter 114(2) and die 110 to the substrate (block 402 in FIG. 4A). The second bare die filter 114(2) can be coupled to the package substrate 104 through die bonding as an example, wherein the second metal interconnects 120(2) of the second bare die filter 114(2) are bonded to the first surface 118(1) of the package substrate 104. As also shown in the fabrication stage 500A in FIG. 5A, to provide support for the vertical integration of the first bare die filter 114(1), the extension metal interconnects 134 are formed and coupled to the first surface 118(1) of the package substrate 104 (block 402 in FIG. 4A). In this example, the extension metal interconnects 134 are formed as metal posts. The extension metal interconnects 134 can be coupled to respective metal pads 502 that are formed on the first surface 118(1) of the package substrate 104.

Then, as illustrated in the exemplary fabrication stage 500B in FIG. 5B, a next exemplary step in the fabrication process 400 can be to encapsulate the second bare die filter 114(2) and the die 110 with a molding material (block 404 in FIG. 4A). In this regard, as shown in FIG. 5B, the first overmold layer 136(1) is formed on the second bare die filter 114(2) and the die 110. The first overmold layer 136(1) may be formed by disposing a mold material sheet on the second bare die filter 114(2) and the die 110. Another optional overmold layer 503 can then be formed on the first overmold layer 136(1). Alternatively, the first overmold layer 136(1) may include two combined layers of sheet mold material that form what is shown as the first and third overmold layers 136(1), 136(3). The second air cavity 116(2) for the second bare die filter 114(2) is maintained free of overmold material. Then, as illustrated in the exemplary fabrication stage 500C in FIG. 5C, a next exemplary step in the fabrication process 400 can be to grind down the first and second overmold layer 136(1), 503 to prepare for the first bare die filter 114(1) to be coupled to the extension metal interconnects 134 to vertically integrate the first bare die filter 114(1) to the second bare die filter 114(2) (block 406 in FIG. 4B). In this regard, the second overmold layer 136(2) and the first overmold layer 136(1) can be grinded down or a portion otherwise removed down the top, fifth surface 128 of the second filter die 126(2) of the second bare die filter 114(2) and to expose the extension metal interconnects 134. Then, as illustrated in the exemplary fabrication stage 500D in FIG. 5D, a next exemplary step in the fabrication process 400 can be to provide an optional RDL 504 comprised of metal pads or lines 506 adjacent to the top, fifth surface 128 of the second filter die 126(2) of the second bare die filter 114(2) to provide for redistributed routing of signals from the package substrate (block 408 in FIG. 4B).

Then, as illustrated in the exemplary fabrication stage 500E in FIG. 5E, a next exemplary step in the fabrication process 400 can be to couple the first metal interconnects 120(1) of the first bare die filter 114(1) to the extension metal interconnects 134 to electrically couple the first bare die filter 114(1) to the package substrate 104 (block 410 in FIG. 4C). The coupling of the first metal interconnects 120(1) of the first bare die filter 114(1) to the extension metal interconnects 134 also physically couples the first bare die filter 114(1) to the package substrate 104. The first air cavity 116(1) for the first bare die filter 114(1) is formed by the space between the first metal interconnects 120(1) and the bottom, second surface of the first filter die 126(1) of the first bare die filter 114(1). Then, as illustrated in the exemplary fabrication stage 500F in FIG. 5F, a next exemplary step in the fabrication process 400 can be to encapsulate the first bare die filter 114(1) with a second overmold layer 136(2) (block 412 in FIG. 4C). A third overmold layer 136(3) can also be disposed on the second overmold layer 136(2) to encapsulate the BDMP 102 (block 412 in FIG. 4C).

In the fabrication process 400 in FIGS. 4A-4C, the extension metal interconnects 134 are formed by forming metal posts on the first surface 118(1) of the package substrate 104. The extension metal interconnects 134 can also be formed by other processes that involve forming openings in an overmold layer through a photolithography or drilling process, as examples, and then disposing a metal material in the openings. This is shown in the exemplary fabrication process 600 in FIG. 6 and shown in the exemplary fabrication stages 700A, 700B in FIGS. 7A and 7B. Note that after the step 604 in FIG. 6 as shown in exemplary fabrication stage 700B in FIG. 7B, the fabrication process 600 can be performed as shown in steps 406-412 in FIGS. 4B and 4C and as shown in exemplary fabrication stages 500C-500F in FIGS. 5C-5F.

Figures 6, 7A, 7B:
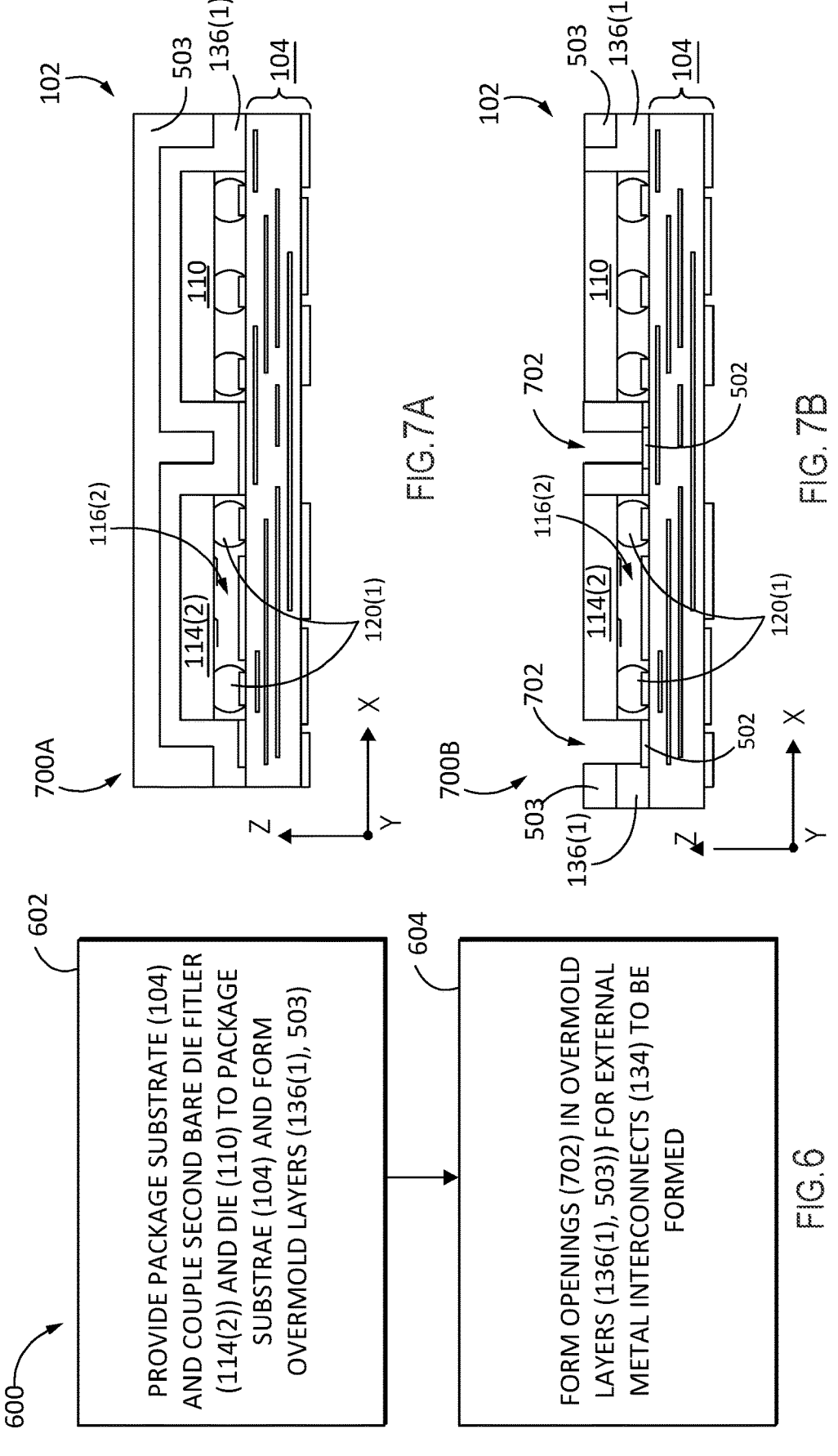
FIG. 6 is a flowchart illustrating another exemplary process of fabricating the integrated bare die package in FIGS. 1A and 1B by forming extension metal interconnects of metal posts on a package substrate through an etching and metal fill process to support and provide electrical connections for the vertically-integrated first bare die filter.
FIGS. 7A and 7B illustrate exemplary fabrication stages according to the exemplary fabrication process in FIG. 6.

In this regard, as illustrated in the exemplary fabrication stage 700A in FIG. 7A, an exemplary step in the fabrication process 600 can be to provide the package substrate 104 and to couple the second bare die filter 114(2) and the die 110 to the substrate (block 602 in FIG. 6). Thereafter, the first overmold layer 136(1) is disposed on the second bare die filter 114(2) and the die 110 like previously described in the fabrication process 400 in FIGS. 4A-4C. Another overmold layer 503 is disposed on the first overmold layer 136(1) (block 602 in FIG. 6). Then, as illustrated in the exemplary fabrication stage 700B in FIG. 7B, a next exemplary step in the fabrication process 600 can be to form openings 702 in first overmold layer 136(1) and the overmold layer 503 down to the metal pads 502 to prepare for the extension metal interconnects 134 to be formed (block 604 in FIG. 6). For example, the openings 702 may be formed in the first overmold layer 136(1) and the overmold layer 503 through a photolithography process where a hard mask (not shown) was disposed on the overmold layer 503 and then exposed (e.g., to ultraviolet (UV) light) to form the openings 702. The overmold layer 503 may be a photoresist coating layer. In another example, the openings 702 are formed by drilling the openings 702 in the first overmold layer 136(1) and the overmold layer 503 with a drill. In either case, after the openings 702 are formed, a metal material is disposed in the openings 702 to form the extension metal interconnects 134 as shown in the fabrication stage 500C in FIG. 5C.

In the fabrication processes 400, 600 in FIGS. 4A-4C and 6, the extension metal interconnects 134 are formed by forming metal posts on the first surface 118(1) of the package substrate 104. The extension metal interconnects 134 can also be formed as another type of component other than metal posts. For example, the extension metal interconnects 134 can be formed as wire bonds. This is shown in the exemplary fabrication process 800 in FIG. 8 and shown in the exemplary fabrication stages 900A, 900B in FIGS. 9A and 9B. Note that after block 804 in FIG. 8 as shown in exemplary fabrication stage 900B in FIG. 9B, the fabrication process 800 can be performed as shown in steps 406-412 in FIGS. 4B and 4C and as shown in exemplary fabrication stages 500C-500F in FIGS. 5C-5F.

Figures 8, 9A, 9B:
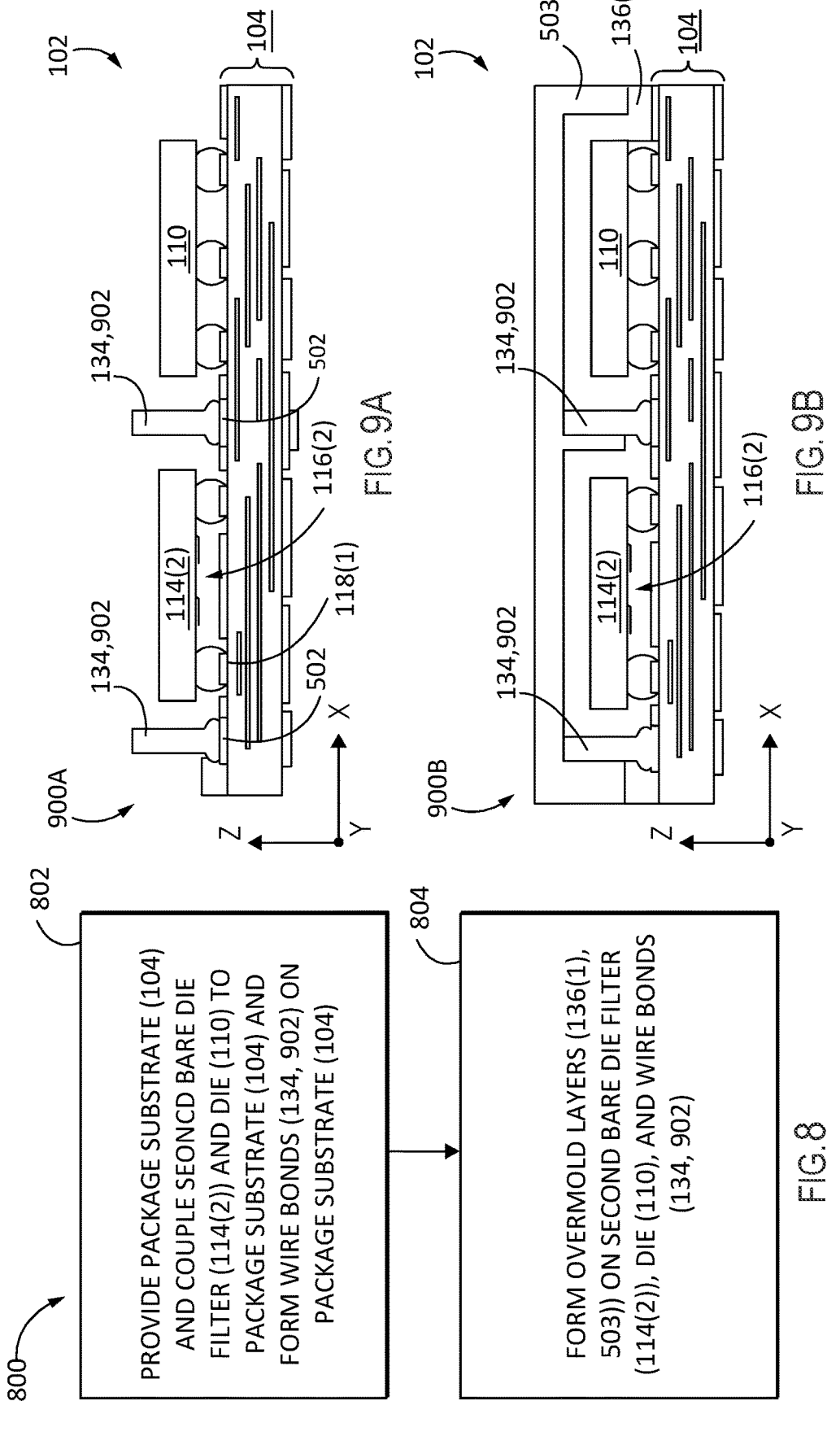
FIG. 8 is a flowchart illustrating another exemplary process of fabricating the integrated bare die package in FIGS. 1A and 1B by forming wire bonds on a package substrate to support and provide electrical connections for the vertically-integrated first bare die filter.
FIGS. 9A and 9B illustrate exemplary fabrication stages according to the exemplary fabrication process in FIG. 8.

In this regard, as illustrated in the exemplary fabrication stage 900A in FIG. 9A, an exemplary step in the fabrication process 600 can be to provide the package substrate 104 and to couple the second bare die filter 114(2) and the die 110 to the substrate (block 802 in FIG. 8). The extension metal interconnects 134 can be formed as wire bonds 902 coupled to the first surface 118(1) of the package substrate 104 (block 802 in FIG. 8). Then, as illustrated in the exemplary fabrication stage 900B in FIG. 9B, a next exemplary step in the fabrication process 800 can be to form the first overmold layer 136(1) on the second bare die filter 114(2), the die 110, and the wire bonds 902 as previously described in the fabrication process 400 in FIGS. 4A-4C (block 804 in FIG. 8). The additional overmold layer 503 can then be formed on the first overmold layer 136(1) as previously described in the fabrication process 400 in FIGS. 4A-4C.

Figure 10:
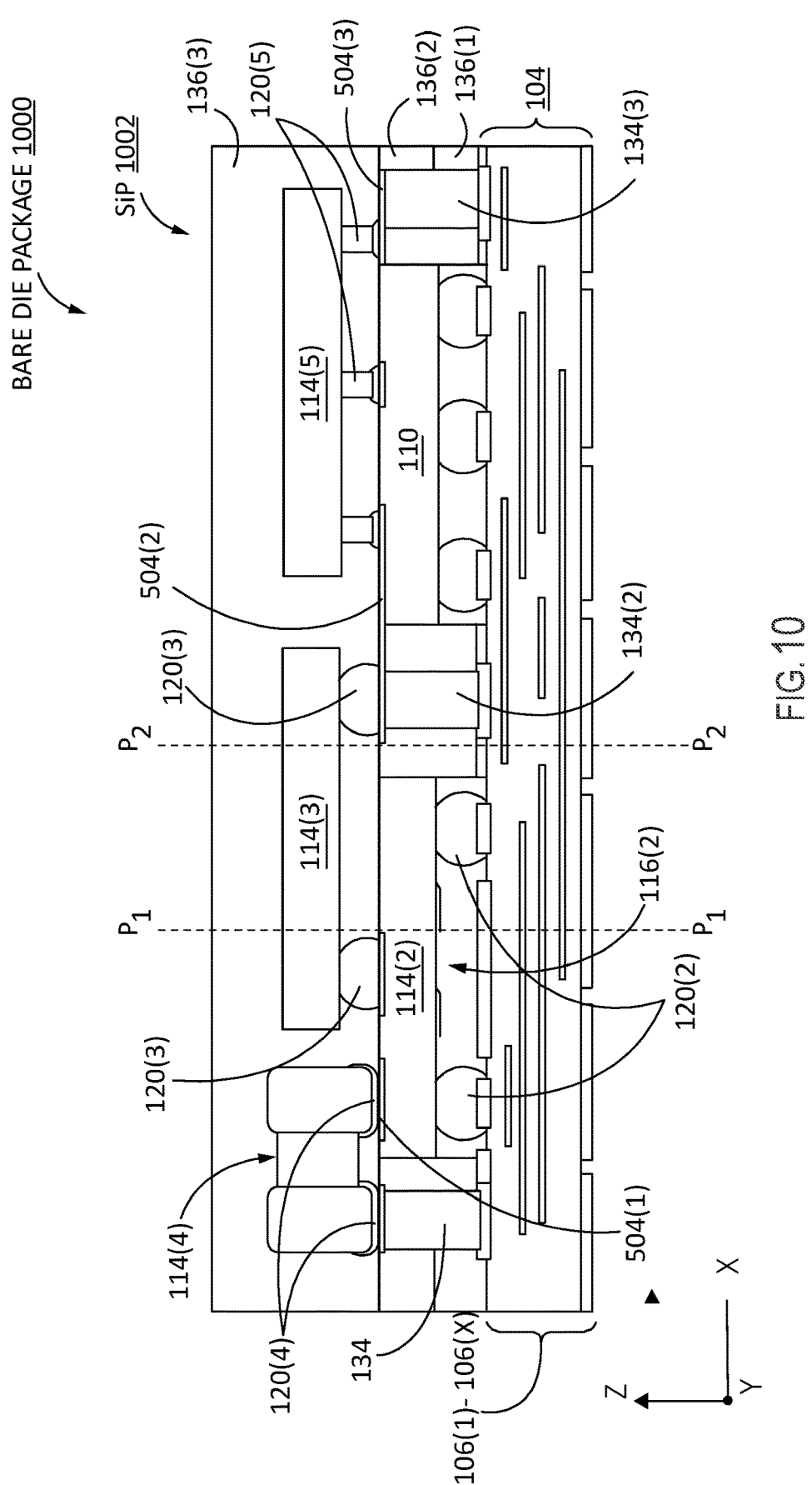
FIG. 10 is a side view of another exemplary integrated bare die package that includes a bare die filter vertically-integrated with a second bare die filter as well as a die that is not a bare die filter than is vertically-integrated with another die.

Other vertically-integrated bare die packages are also possible. For example, FIG. 10 is a side view of another exemplary integrated bare die package 1000 that includes a bare die filter vertically-integrated with a second bare die filter as well as a die that is not a bare die filter than is vertically-integrated with another die. Common components between the bare die package 1000 in FIG. 10 and the bare die package 100 and BDMP 102 in FIGS. 1A and 1B are shown with common element numbers, and thus are not re-described. In this example, the bare die package 1000 that includes a bare die filter vertically is integrated with a system-in-a package (SiP) 1002. The bare die package 1000 includes the SiP 1002, because the components adjacent to and coupled to the first surface 118(1) of the package substrate 104 are not bare die packages in this example.

In this regard, as shown in FIG. 10, a third component 114(3), which is a die 114(3) in this example, is vertically integrated to the second bare die filter 114(2). However, the second bare die filter 114(2) does not fully overlap the die 114(3) in the second direction (vertical direction in the Z-axis direction). Instead, the die 114(3) is shifted in the first direction (horizontal direction in the X-axis direction), such that the die 114(3) and the second bare die filter 114(2) both intersect the first common plane P₁ in the second direction (vertical direction in the Z-axis direction). However, the die 114(3) intersects a second plane P₂ in the second direction (vertical direction in the Z-axis direction) that does not intersect the second bare die filter 114(2). The die 114(3) is coupled to the extension metal interconnect 134(2) and the package substrate 104 through third metal interconnects 120(3). Another second component in the form of a passive electrical device 114(4) (e.g., an inductor, a capacitor, or a resistor) is vertically integrated with the second bare die filter 114(2). In this example, fourth metal interconnects 120(4) for the passive electrical device 114(4) are coupled to a first extension metal interconnect 134(1) to physically support and electrically couple the passive electrical device 114(4) to the package substrate 104. The first metal interconnect 120(1) is coupled to a second extension metal interconnect 134(2) to physically support and electrically couple the die 114(4) to the package substrate 104. A fifth metal interconnect 120(5) of a fifth component 114(5) (e.g., another die 114(5)) is coupled to a third extension metal interconnect 134(3) to physically support and electrically couple the die 114(5) to the package substrate 104. The bare die package 1000 may also include RDLs 504(1), 504(2), 504(3) that redistribute electrical connections to the die 114(3), the passive electrical device 114(4), and/or the die 114(5).

Figure 11:
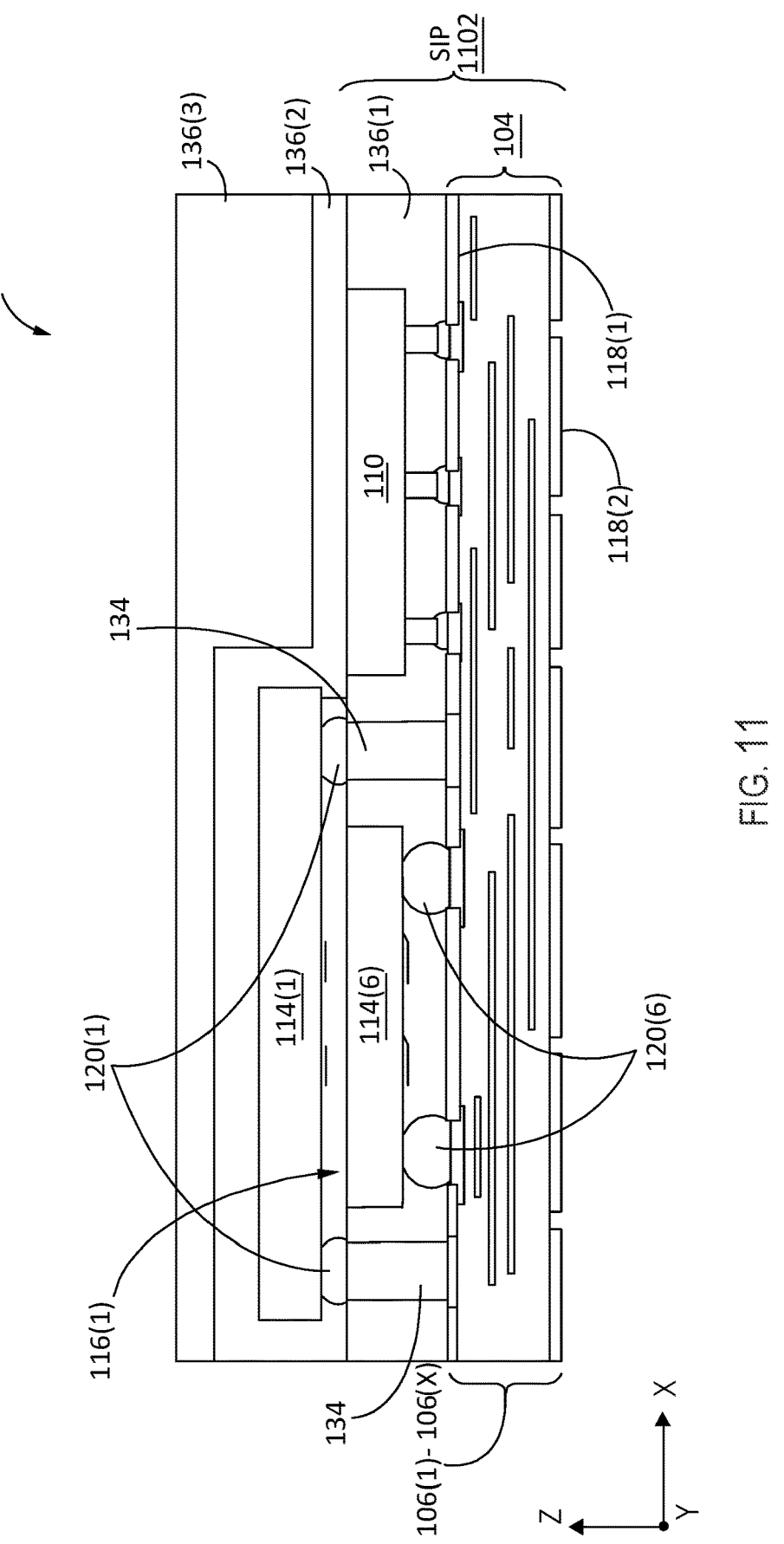
FIG. 11 is a side view of another exemplary integrated bare die package in the form of a system-in-a-package (SiP) that includes a first bare die filter vertically-integrated with a second component that is undermolded.

FIG. 11 shows yet another example of a vertically-integrated bare die package 1100 that can be realized using the aspects disclosed herein. In this example, the bare die package 1100 that includes a bare die filter vertically is integrated with a SiP 1102. The bare die package 1100 includes the SiP 1102, because the components adjacent to and coupled to the first surface 118(1) of the package substrate 104 are not bare die packages in this example. Common components between the bare die package 1100 and SiP 1102 in FIG. 11 and the bare die package 100 and BDMP 102 in FIGS. 1A and 1B are shown with common element numbers, and thus are not re-described. In the SiP 1102 in FIG. 11, the first bare die filter 114(1) is vertically integrated with another component 114(6) that is another die 114(6) in this example and that is not a bare die filter, like the second bare die filter 114(2) in the BDMP 102 in FIGS. 1A and 1B. The die 114(6) is coupled to the package substrate 104 through sixth metal interconnects 120(6). For example, the die 114(6) could be an application die that contains circuitry for performing tasks within the bare die package 1100. The die 114(6), as a radio-frequency integrated circuit (RFIC) die that includes RF front-end and/or transceiver circuits die, may be electrically coupled to the first bare die filter 114(1) through the package substrate 104 so that the first bare die filter 114(1) provides a filter for filtering signals for the die 114(6).

Figure 12:
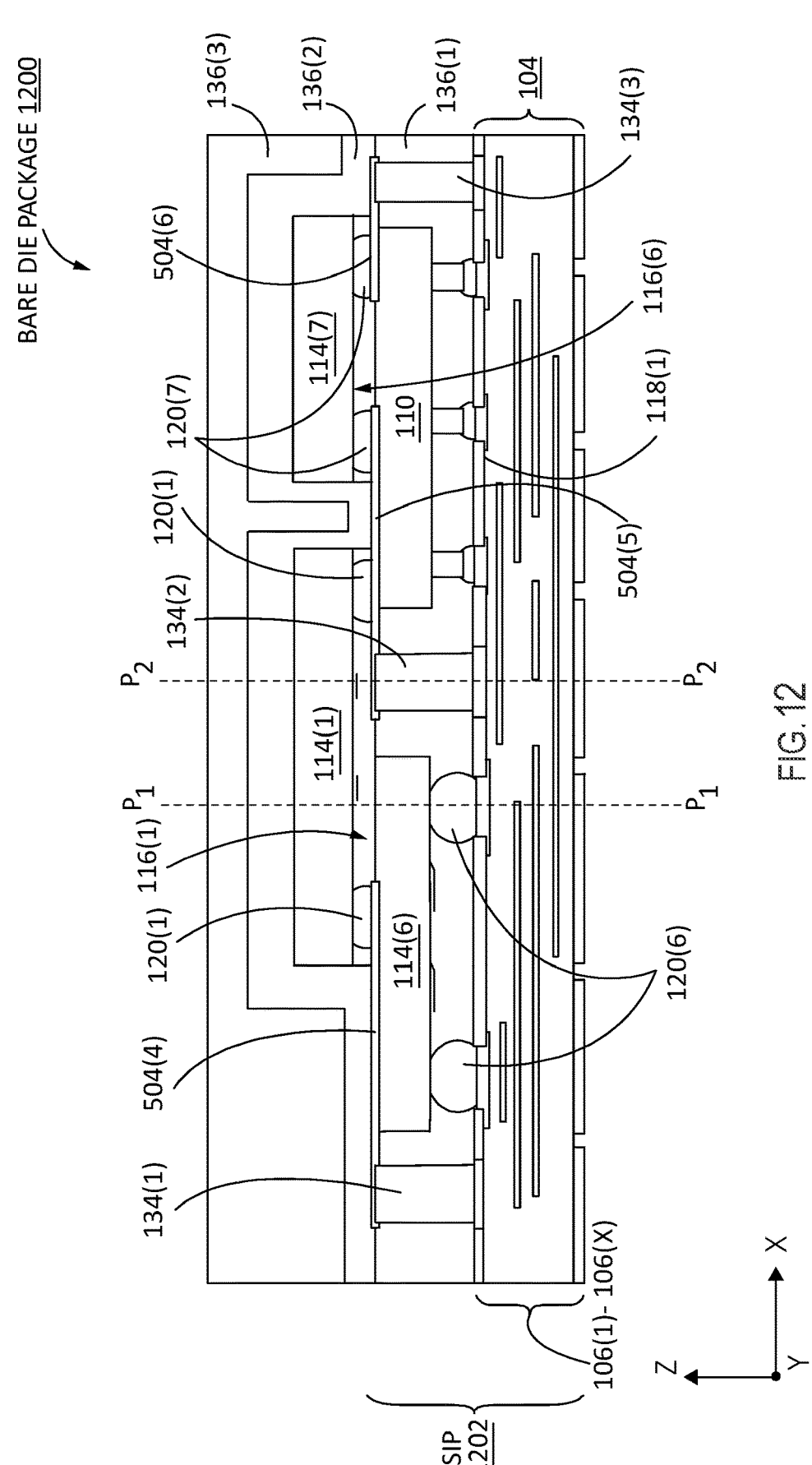
FIG. 12 is a side view of another exemplary integrated bare die package in the form of a SiP that includes multiple bare die filters vertically-integrated with second components that are undermolded.

FIG. 12 is a side view of another exemplary integrated bare die package 1200 that includes a multiple bare die filters vertically-integrated with second components adjacent to a package substrate that are undermolded to show another example. In this example, the bare die package 1200 that includes bare die filters is vertically integrated with a SiP 1202. The bare die package 1200 includes the SiP 1202, because the components adjacent to and coupled to the first surface 118(1) of the package substrate 104 are not bare die packages in this example. Common components between the bare die packages 100, 1000, 1100 in FIGS. 1A-1B, 10, and 11 and the bare die package 1200 in FIG. 12 are shown with common element numbers, and thus are not re-described.

In this regard, as shown in FIG. 12, the first bare die filter 114(1) is vertically integrated to another component 114(6), which is another die 114(6) in this example. Similar to the bare die package 1000 in FIG. 10, the die 114(6) does not fully overlap the first bare die filter 114(1) in the second direction (vertical direction in the Z-axis direction). Instead, the first bare die filter 114(1) is shifted in the first direction (horizontal direction in the X-axis direction), such that the first bare die filter 114(1) and the die 114(6) both intersect the first common plane P₁ in the second direction (vertical direction in the Z-axis direction). However, the first bare die filter 114(1) intersects a second plane P₂ in the second direction (vertical direction in the Z-axis direction) that does not intersect the die 114(6). Another seventh bare die filter 114(7) is vertically integrated with the die 110 in this example. In this example, a seventh metal interconnect 120(7) for the bare die filter 114(7) is coupled to the third extension metal interconnect 134(3) to physically support and electrically couple the bare die filter 114(7) to the package substrate 104 and to form and maintain its sixth air cavity 116(6). The first metal interconnect 120(1) is coupled to the first extension metal interconnect 134(1) to physically support and electrically couple the first bare die filter 114(1) to the package substrate 104. The bare die package 1200 in this example includes RDLs 504(4), 504(5), 504(6) that redistribute electrical connections to the first bare die filter 114(1) and the bare die filter 114(7).

Figure 13:
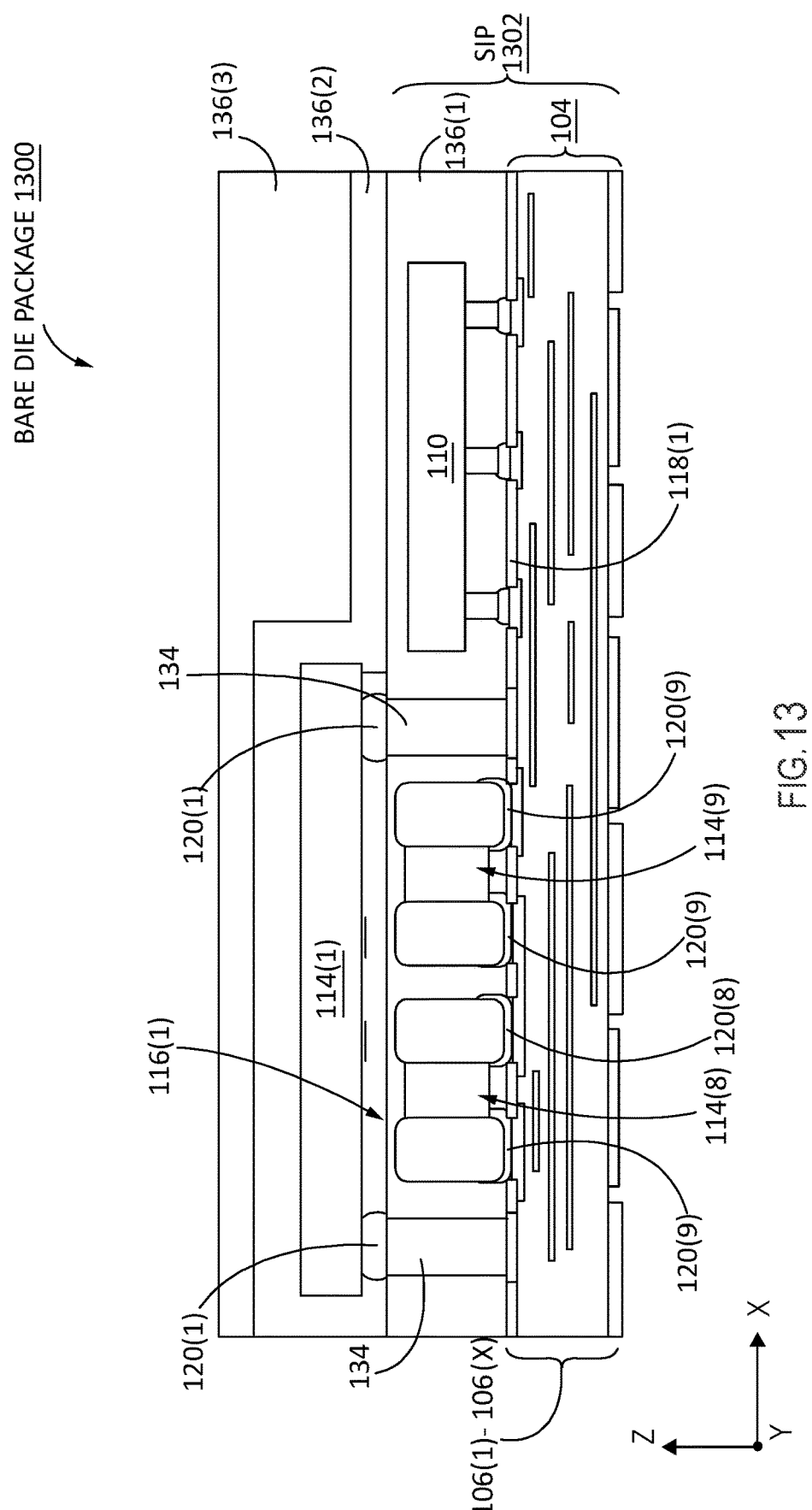
FIG. 13 is a side view of an exemplary integrated bare die package in the form of a SiP that includes a first bare die filter vertically-integrated with a second component of passive electrical devices.

FIG. 13 is a side view of another exemplary integrated bare die package 1300 that includes the first bare die filter 114(1) vertically-integrated with a second component that are passive electrical devices 114(8), 114(9). In this example, the bare die package 1300 that includes the bare die filter 114(1) vertically integrated with a SiP 1302. The bare die package 1300 includes the SiP 1302, because the components adjacent to and coupled to the first surface 118(1) of the package substrate 104 are not bare die packages in this example. Common components between the bare die packages 100, 1000, 1100 in FIGS. 1A-1B, 10, and 11 and the bare die package 1200 in FIG. 12 are shown with common element numbers, and thus are not re-described. In this regard, as shown in FIG. 13, the first bare die filter 114(1) is vertically integrated to second components, which are passive electrical devices 114(8), 114(9) and that is not a bare die filter, like the second bare die filter 114(2) in the BDMP 102 in FIGS. 1A and 1B. For example, the passive electrical devices 114(8), 114(9) could be inductors, capacitors, and/or resistors, or any combination thereof. The passive electrical devices 114(8), 114(9) are coupled to the package substrate 104 through eighth and ninth metal interconnects 120(8), 120(9).

Figure 14:
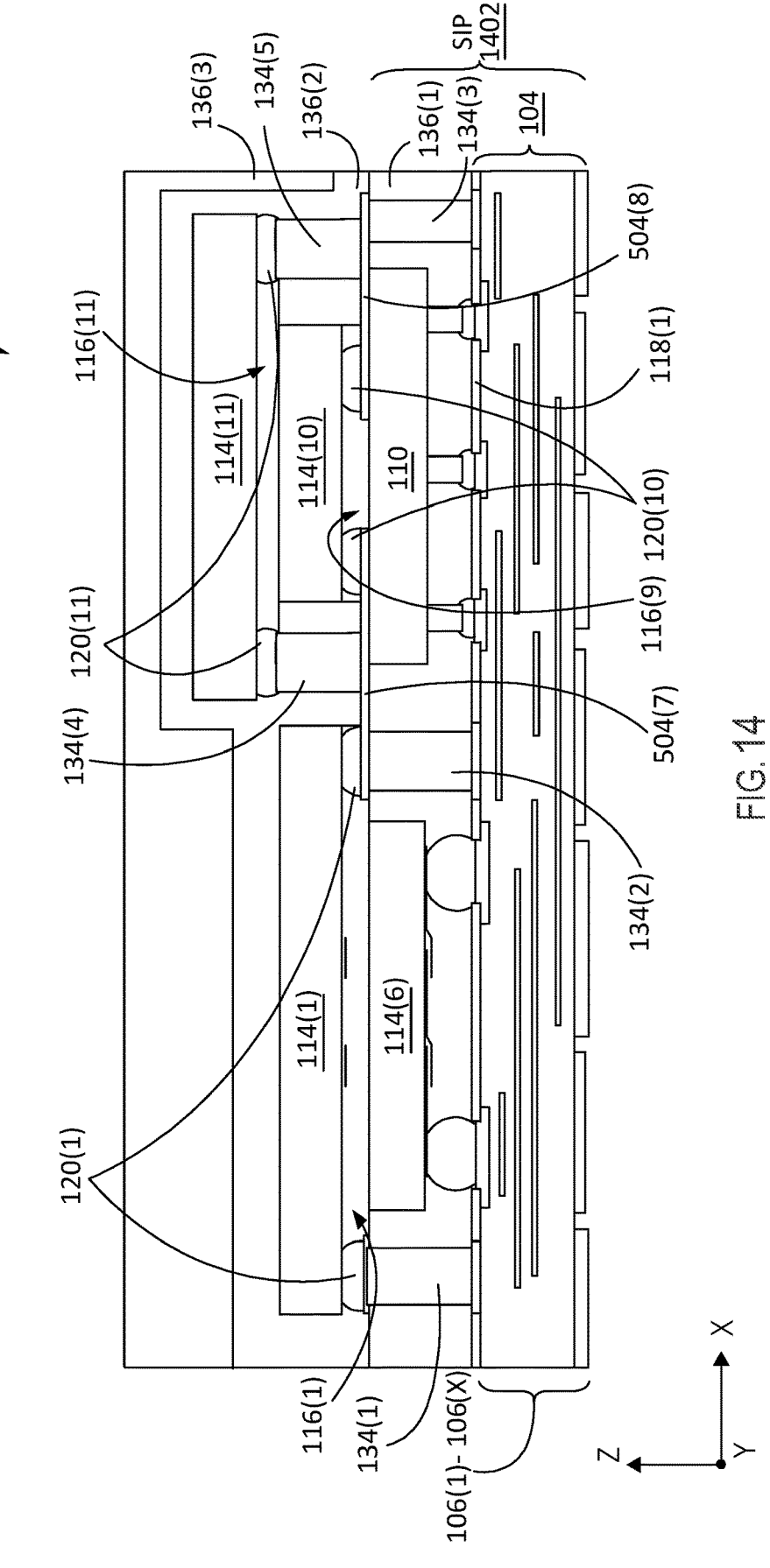
FIG. 14 is a side view of an exemplary integrated bare die package in the form of a SiP that includes a multiple bare die filter vertically-integrated to each other with a second component that is an integrated circuit (IC) die.

FIG. 14 is a side view of another exemplary integrated bare die package 1400 that includes the first bare die filter 114(1) vertically-integrated with the die 114(6) as previously described and shown in the SiP 1102 in FIG. 11. Common components between the bare die packages 1100 in FIG. 11 and the bare die package 1400 in FIG. 14 are shown with common element numbers, and thus are not re-described. In this example, the bare die package 1400 that includes a bare die filter is vertically integrated with a SiP 1402. The bare die package 1400 includes the SiP 1402, because the components adjacent to and coupled to the first surface 118(1) of the package substrate 104 are not bare die packages in this example. In this regard, as shown in FIG. 14, the first bare die filter 114(1) is vertically integrated to die 114(6) as previously described in the SiP 1102 in FIG. 11. A tenth die filter 114(10) is provided that is vertically integrated with the die 110. Tenth metal interconnects 120(10) of the bare die filter 114(10) are coupled to the second and third extension metal interconnects 134(2), 134(3) that are coupled to the package substrate 104 to physically and electrically couple the bare die filter 114(10) to the package substrate 104. An air cavity 116(9) is formed between the bare die filter 114(10) and the die 110 by the space formed between the bare die filter 114(10) and the die 110 created by the tenth metal interconnects 120(10) standing off the bare die filter 114(10) from the die 110.

With continuing reference to FIG. 14, an eleventh bare die filter 114(11) is provided that is vertically integrated with the die filter 114(10) in this example to provide an additional vertical integration in the SiP 1402. Eleventh metal interconnects 120(11) of the bare die filter 114(11) are coupled to the fourth and fifth extension metal interconnects 134(4), 134(5) that are coupled to RDLs 504(7), 504(8), which are in turn coupled to second and third extension metal interconnects 134(2), 134(3) coupled to package substrate 104. Fourth and fifth extension metal interconnects 134(4), 134(5) physically and electrically couple the bare die filter 114(11) to the package substrate 104. An air cavity 116(10) is formed between the bare die filter 114(11) and the bare die filter 114(10) by the space formed between the bare die filter 114(11) and the bare die filter 114(10) created by the eleventh metal interconnects 120(11) standing off the bare die filter 114(11) from the bare die filter 114(10).

Note that the fabrication processes 300, 400, 600, 800 in FIGS. 3-4C, 6, and 8, and according to any other aspects disclosed herein, disclosed as fabricating a BDMP of a bare die package can also be used to fabricate the bare die packages 1000, 1100, 1200, 1300, and 1400 in FIGS. 10-14 that include respective SiPs 1002, 1102, 1202, 1302, and 1402. If fabrication processes 300, 400, 600, 800 in FIGS. 3-4C, 6, and 8 are used to fabricate the bare die packages 1000, 1100, 1200, 1300, and 1400 in FIGS. 10-14 that include respective SiPs 1002, 1102, 1202, 1302, and 1402, the first overmold layer 136(1) can be disposed also underneath the components that are directly adjacent to the first surface 118(1) of the package substrate 104. In this manner, an overmold material will underfill underneath the components that are directly adjacent to the first surface 118(1), in the space formed between the components and the package substrate 104 by respective metal interconnects coupling such components to the package substrate 104.

The integrated bare die package described herein can be provided as BDMP and/or systems-in-a-package (SiP) as examples. An integrated bare die package that includes a first bare die filter vertically-integrated with a second component, including, but not limited, to the integrated bare die packages 100, 1000, 1100, 1200, 1300, 1400 in FIGS. 1A-1B, 5A-5F, 7A-7B, 9A-9B, 10-14 and according to any of the exemplary fabrication processes 300, 400, 600, 800 in FIGS. 3-4C, 6, and 8, and according to any other aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 15:
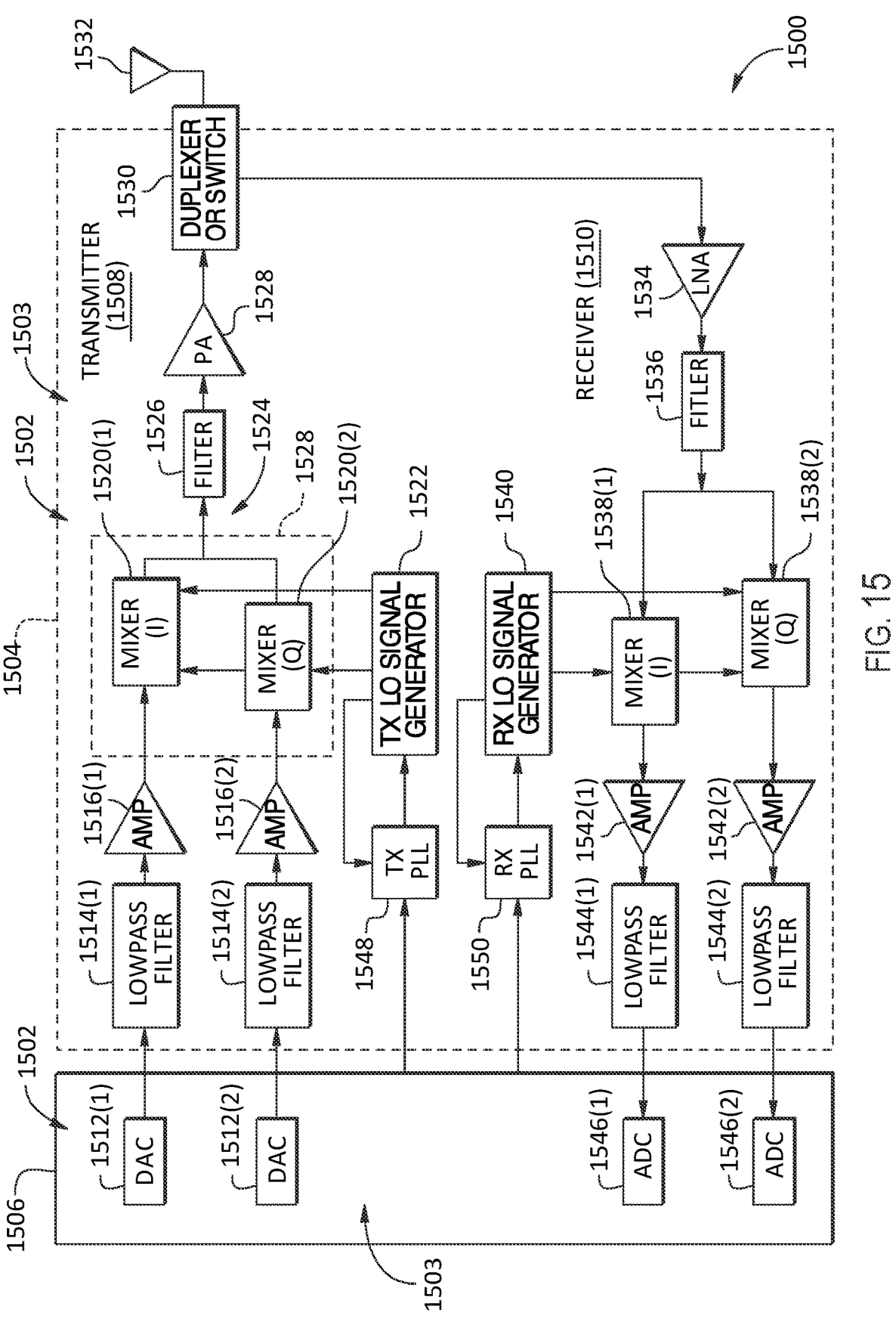
FIG. 15 is a block diagram of an exemplary wireless communications device that includes radio-frequency (RF) components that can include an integrated bare die package that includes a first bare die filter vertically-integrated with a second component, including, but not limited, to the integrated bare die packages in FIGS. 1A-1B, 5A-5F, 7A-7B, 9A-9B, 10-14 and according to any of the exemplary fabrication processes in FIGS. 3-4C, 6, and 8.

In this regard, FIG. 15 illustrates an exemplary wireless communications device 1500 that includes radio frequency (RF) components formed from one or more ICs 1502, wherein any of the ICs 1502 can include an integrated bare die package 1503 that includes a first bare die filter vertically-integrated with a second component, including, but not limited, to the integrated bare die packages 100, 1000, 1100, 1200, 1300, 1400 in FIGS. 1A-1B, 5A-5F, 7A-7B, 9A-9B, 10-14 and according to any of the exemplary fabrication processes 300, 400, 600, 800 in FIGS. 3-4C, 6, and 8, and according to any aspects disclosed herein. The wireless communications device 1500 may include or be provided in any of the above-referenced devices, as examples. As shown in FIG. 15, the wireless communications device 1500 includes a transceiver 1504 and a data processor 1506. The data processor 1506 may include a memory to store data and program codes. The transceiver 1504 includes a transmitter 1508 and a receiver 1510 that support bi-directional communications. In general, the wireless communications device 1500 may include any number of transmitters 1508 and/or receivers 1510 for any number of communication systems and frequency bands. All or a portion of the transceiver 1504 may be implemented on one or more analog ICs, RFICs, mixed-signal ICs, etc.

The transmitter 1508 or the receiver 1510 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1510. In the direct-conversion architecture, a signal is frequency-converted between RF and baseband in one stage. The super-heterodyne and direct-conversion architectures may use different circuit blocks and/or have different requirements. In the wireless communications device 1500 in FIG. 15, the transmitter 1508 and the receiver 1510 are implemented with the direct-conversion architecture.

In the transmit path, the data processor 1506 processes data to be transmitted and provides I and Q analog output signals to the transmitter 1508. In the exemplary wireless communications device 1500, the data processor 1506 includes digital-to-analog converters (DACs) 1512(1), 1512(2) for converting digital signals generated by the data processor 1506 into the I and Q analog output signals, e.g., I and Q output currents, for further processing.

Within the transmitter 1508, lowpass filters 1514(1), 1514(2) filter the I and Q analog output signals, respectively, to remove undesired signals caused by the prior digital-to-analog conversion. Amplifiers (AMPs) 1516(1), 1516(2) amplify the signals from the lowpass filters 1514(1), 1514(2), respectively, and provide I and Q baseband signals. An upconverter 1518 upconverts the I and Q baseband signals with I and Q transmit (TX) local oscillator (LO) signals through mixers 1520(1), 1520(2) from a TX LO signal generator 1522 to provide an upconverted signal 1524. A filter 1526 filters the upconverted signal 1524 to remove undesired signals caused by the frequency upconversion as well as noise in a receive frequency band. A power amplifier (PA) 1528 amplifies the upconverted signal 1524 from the filter 1526 to obtain the desired output power level and provides a transmit RF signal. The transmit RF signal is routed through a duplexer or switch 1530 and transmitted via an antenna 1532.

In the receive path, the antenna 1532 receives signals transmitted by base stations and provides a received RF signal, which is routed through the duplexer or switch 1530 and provided to a low noise amplifier (LNA) 1534. The duplexer or switch 1530 is designed to operate with a specific receive (RX)-to-TX duplexer frequency separation, such that RX signals are isolated from TX signals. The received RF signal is amplified by the LNA 1534 and filtered by a filter 1536 to obtain a desired RF input signal. Down-conversion mixers 1538(1), 1538(2) mix the output of the filter 1536 with I and Q RX LO signals (i.e., LO_I and LO_Q) from an RX LO signal generator 1540 to generate I and Q baseband signals. The I and Q baseband signals are amplified by AMPs 1542(1), 1542(2) and further filtered by lowpass filters 1544(1), 1544(2) to obtain I and Q analog input signals, which are provided to the data processor 1506. In this example, the data processor 1506 includes analog-to-digital converters (ADCs) 1546(1), 1546(2) for converting the analog input signals into digital signals to be further processed by the data processor 1506.

In the wireless communications device 1500 of FIG. 15, the TX LO signal generator 1522 generates the I and Q TX LO signals used for frequency upconversion, while the RX LO signal generator 1540 generates the I and Q RX LO signals used for frequency downconversion. Each LO signal is a periodic signal with a particular fundamental frequency. A TX phase-locked loop (PLL) circuit 1548 receives timing information from the data processor 1506 and generates a control signal used to adjust the frequency and/or phase of the TX LO signals from the TX LO signal generator 1522. Similarly, an RX PLL circuit 1550 receives timing information from the data processor 1506 and generates a control signal used to adjust the frequency and/or phase of the RX LO signals from the RX LO signal generator 1540.

Figure 16:
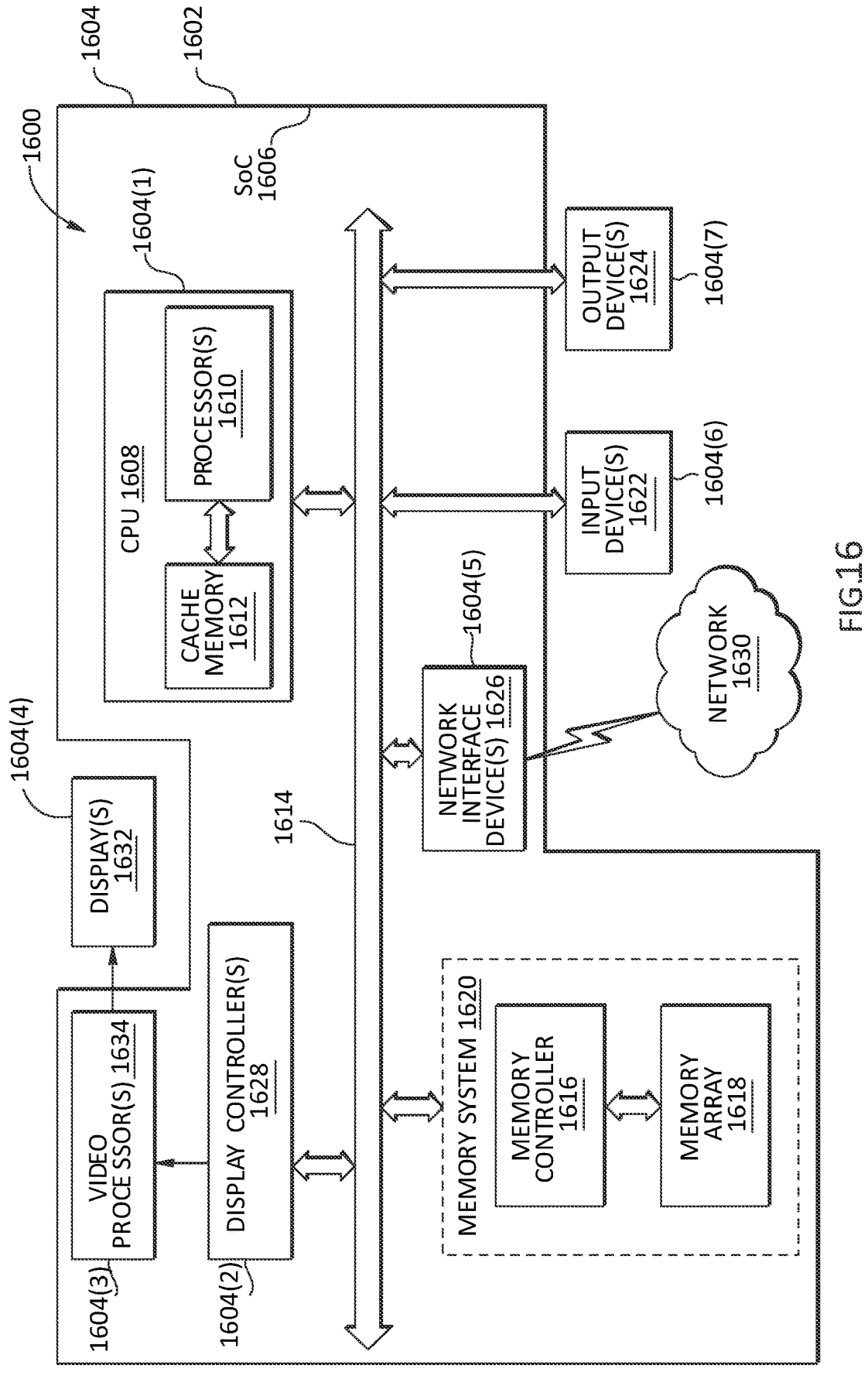
FIG. 16 is a block diagram of an exemplary processor-based system that can include an integrated bare die package that includes a first bare die filter vertically-integrated with a second component, including, but not limited, to the integrated bare die packages in FIGS. 1A-1B, 5A-5F, 7A-7B, 9A-9B, 10-14 and according to any of the exemplary fabrication processes in FIGS. 3-4C, 6, and 8.

FIG. 16 illustrates an example of a processor-based system 1600. The components of the processor-based system 1600 are ICs 1602. Some or all of the components in the processor-based system 1600 can be provided in or include an integrated bare die package 1604(1)-1604(7) that includes a first bare die filter vertically-integrated with a second component, including, but not limited, to the integrated bare die packages 100, 1000, 1100, 1200, 1300, 1400 in FIGS. 1A-1B, 5A-5F, 7A-7B, 9A-9B, 10-14 and according to any of the exemplary fabrication processes 300, 400, 600, 800 in FIGS. 3-4C, 6, and 8, and according to any aspects disclosed herein. In this example, the processor-based system 1600 may be formed in or included as part of an integrated bare die package 1604 and as a system-on-a-chip (SoC) 1606. The processor-based system 1600 includes a CPU 1608 that includes one or more processors 1610, which may also be referred to as CPU cores or processor cores. The CPU 1608 can be included in an integrated bare die package 1604(1). The CPU 1608 may have cache memory 1612 coupled to the CPU 1608 for rapid access to temporarily stored data. The CPU 1608 is coupled to a system bus 1614 and can intercouple master and slave devices included in the processor-based system 1600. As is well known, the CPU 1608 communicates with these other devices by exchanging address, control, and data information over the system bus 1614. For example, the CPU 1608 can communicate bus transaction requests to a memory controller 1616 as an example of a slave device. Although not illustrated in FIG. 16, multiple system buses 1614 could be provided, wherein each system bus 1614 constitutes a different fabric.

Other master and slave devices can be connected to the system bus 1614. As illustrated in FIG. 16, these devices can include a memory system 1620 that includes the memory controller 1616 and a memory array(s) 1618, one or more input devices 1622, one or more output devices 1624, one or more network interface devices 1626, and one or more display controllers 1628, as examples. The network interface devices 1626 can be included in or be an integrated bare die package 1604(5). Each of the memory system 1620, the one or more input devices 1622, the one or more output devices 1624, the one or more network interface devices 1626, and the one or more display controllers 1628 can be provided in the same or different circuit packages. The input devices 1622 and/or the output devices 1624 can be included in respective integrated bare die packages 1604(6) 1604(7). The input device(s) 1622 can include any type of input device, including, but not limited to, input keys, switches, voice processors, etc. The output device(s) 1624 can include any type of output device, including, but not limited to, audio, video, other visual indicators, etc. The network interface device(s) 1626 can be any device configured to allow exchange of data to and from a network 1630. The network 1630 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1626 can be configured to support any type of communications protocol desired.

The CPU 1608 may also be configured to access the display controller(s) 1628 over the system bus 1614 to control information sent to one or more displays 1632. The display 1632 can be included in an integrated bare die package 1604(4). The display controller(s) 1628 sends information to the display(s) 1632 to be displayed via one or more video processors 1634, which process the information to be displayed into a format suitable for the display(s) 1632. The display controller(s) 1628 and video processor(s) 1634 can be included in or be an integrated bare die package 1604(2), 1604(3) and the same or different circuit packages, and in the same or different circuit packages containing the CPU 1608 as an example. The display(s) 1632 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A bare die package, comprising:
   a package substrate comprising one or more metallization layers parallel to each other in a first direction;
   a first bare die filter coupled to a first surface of the package substrate; and
   a second component coupled to the first surface of the package substrate;
   wherein the first bare die filter and the second component each intersect a common first plane in a second direction orthogonal to the first direction.

2 The bare die package of clause 1, wherein:
   the second component is adjacent to the first surface of the package substrate; and the second component is between the first surface of the package substrate and the first bare die filter in the second direction.

3. The bare die package of clause 2, further comprising a plurality of extension metal interconnects coupled to the package substrate and extending in the second direction;

the first bare die filter is coupled to the plurality of extension metal interconnects.

4. The bare die package of clause 3, wherein the first bare die filter comprises:

a first filter die comprising a second surface adjacent to the second component, a third surface opposite the second surface; and a plurality of first metal interconnects coupled to the plurality of extension metal interconnects such that a first air cavity is formed between the second surface of the first filter die and the second component.

5. The bare die package of clause 3 or 4, wherein at least one first extension metal interconnect of the plurality of extension metal interconnects is adjacent to the second component in the first direction.

6 The bare die package of any of clauses 3-5, further comprising a first redistribution layer (RDL) coupled to a first extension metal interconnect of the plurality of extension metal interconnects and the first bare die filter.

7. The bare die package of clause 1, wherein:

the first bare die filter is adjacent to the first surface of the package substrate; and the first bare die filter is between the first surface of the package substrate and the second component in the second direction.

8. The bare die package of clause 7, wherein the first bare die filter comprises:

a first filter die comprising a second surface adjacent to the first surface of the package substrate, a third surface opposite the second surface; and a plurality of first metal interconnects coupled to the first surface of the package substrate such that a first air cavity is formed between the second surface of the first filter die and the first surface of the package substrate.

9. The bare die package of clause 7 or 8, further comprising a plurality of extension metal interconnects coupled to the package substrate and extending in the second direction; and the second component is coupled to the plurality of extension metal interconnects.

10. The bare die package of clause 9, wherein at least one first extension metal interconnect of the plurality of extension metal interconnects is adjacent to the first bare die filter in the first direction.

11. The bare die package of clause 9 or 10, wherein:

a second surface of the first bare die filter adjacent to the first surface of the package substrate is disposed a first height from the first surface of the package substrate; and the plurality of extension metal interconnects extend in the second direction to a second height that is equal to or greater than the first height.

12. The bare die package of any of clauses 7-11, further comprising a first redistribution layer (RDL) coupled to a first extension metal interconnect of the plurality of extension metal interconnects and the second component.

13. The bare die package of any of clauses 1-12, wherein the second component comprises a second bare die filter.

14. The bare die package of clause 13, wherein the second bare die filter comprises a second filter die comprising:

a sixth surface adjacent to the first surface of the package substrate;

a seventh surface opposite the sixth surface; and a plurality of second metal interconnects coupled to the sixth surface and the first surface of the package substrate such that a second cavity is formed between the sixth surface of the second filter die and the first surface of the package substrate.

15. The bare die package of any of clauses 1-12, wherein the second component comprises a second die.

16. The bare die package of any of clauses 1-12, wherein the second component comprises at least one second passive electrical device.

17. The bare die package of any of clauses 1-16 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

18. A method of fabricating a bare die package, comprising:

providing a package substrate comprising one or more metallization layers parallel to each other in a first direction;

electrically coupling a second component to a first surface of the package substrate; and electrically coupling a first bare die filter to a first surface of the package substrate, such that the first bare die filter and the second component each intersect a common first plane in a second direction orthogonal to the first direction.

19. The method of clause 18, further comprising:

placing a fourth surface of the second component adjacent to the first surface of the package substrate; and placing the first bare die filter adjacent to a fifth surface of the second component opposite of the fourth surface.

20. The method of clause 19, further comprising forming a plurality of extension metal interconnects coupled to the package substrate and extending in the second direction;

wherein electrically coupling the first bare die filter to the first surface of the package substrate comprises coupling the first bare die filter to the plurality of extension metal interconnects.

21. The method of clause 20, further comprising forming a first redistribution layer (RDL) coupled to a first extension metal interconnect of the plurality of extension metal interconnects and the first bare die filter.

22 The method of clause 21, further comprising:

disposing a first overmold layer on the second component and the plurality of extension metal interconnects; and grinding down the first overmold layer to a fifth surface of the second component;

wherein forming the RDL further comprises forming the RDL layer adjacent to the fifth surface of the second component.

23. The method of clause 22, further comprising forming a second overmold layer adjacent to the first bare die filter.

24. The method of any of clauses 18-23, wherein electrically coupling the first bare die filter to the first surface of the package substrate comprises coupling a plurality of first metal interconnects of the first bare die filter to the plurality of extension metal interconnects such that a first air cavity is formed between a first filter die of the first bare die filter and the second component.

25 The method of clause 18, further comprising:

placing a second surface of the first bare die filter adjacent to the first surface of the package substrate; and placing the second component adjacent to a third surface of the first bare die filter opposite of the second surface.

26. The method of clause 25, further comprising forming a plurality of extension metal interconnects coupled to the package substrate and extending in the second direction;

wherein electrically coupling the second component to the first surface of the package substrate comprises coupling the second component to the plurality of extension metal interconnects.

27. The method of clause 26, further comprising a first redistribution layer (RDL) coupled to a first extension metal interconnect of the plurality of extension metal interconnects and the second component.

28 The method of clause 27, further comprising:

disposing a first overmold layer on the first bare die filter and the plurality of extension metal interconnects; and grinding down the first overmold layer to the third surface of the first bare die filter;

wherein forming the RDL further comprises forming the RDL adjacent to the third surface of the first bare die filter.

29 The method of clause 28, further comprising forming a second overmold layer adjacent a fifth surface of the second component.

30. The method of any of clauses 25-29, wherein electrically coupling the first bare die filter to the first surface of the package substrate comprises coupling a plurality of first metal interconnects of the first bare die filter to the first surface of the package substrate such that a first air cavity is formed between a first filter die of the first bare die filter and the first surface of the package substrate.

What is claimed is:

1. A bare die package, comprising:

a package substrate comprising one or more metallization layers parallel to each other in a first direction;

a first bare die filter coupled to a first surface of the package substrate and adjacent to the first surface of the package; and a second component coupled to the first surface of the package substrate;

wherein the first bare die filter and the second component each intersect a common first plane in a second direction orthogonal to the first direction;

wherein the first bare die filter is between the first surface of the package substrate and the second component in the second direction.

2. The bare die package of claim 1, wherein the first bare die filter comprises:

a first filter die comprising a second surface adjacent to the first surface of the package substrate, a third surface opposite the second surface; and a plurality of first metal interconnects coupled to the first surface of the package substrate such that a first air cavity is formed between the second surface of the first filter die and the first surface of the package substrate.

3. The bare die package of claim 1, further comprising a plurality of extension metal interconnects coupled to the package substrate and extending in the second direction; and the second component is coupled to the plurality of extension metal interconnects.

4. The bare die package of claim 3, wherein at least one first extension metal interconnect of the plurality of extension metal interconnects is adjacent to the first bare die filter in the first direction.

5. The bare die package of claim 3, wherein:

a second surface of the first bare die filter adjacent to the first surface of the package substrate is disposed a first height from the first surface of the package substrate; and the plurality of extension metal interconnects extend in the second direction to a second height that is equal to or greater than the first height.

6. The bare die package of claim 1, further comprising a first redistribution layer (RDL) coupled to a first extension metal interconnect of the plurality of extension metal interconnects and the second component.

7. The bare die package of claim 1, wherein the second component comprises a second bare die filter.

8. The bare die package of claim 7, wherein the second bare die filter comprises a second filter die comprising:

a sixth surface adjacent to the first surface of the package substrate;

a seventh surface opposite the sixth surface; and a plurality of second metal interconnects coupled to the sixth surface and the first surface of the package substrate such that a second cavity is formed between the sixth surface of the second filter die and the first surface of the package substrate.

9. The bare die package of claim 1, wherein the second component comprises a second die.

10. The bare die package of claim 1, wherein the second component comprises at least one second passive electrical device.

11. The bare die package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. A method of fabricating a bare die package, comprising:

providing a package substrate comprising one or more metallization layers parallel to each other in a first direction;

electrically coupling a second component to a first surface of the package substrate; and electrically coupling a first bare die filter to a first surface of the package substrate and adjacent to the first surface of the package;

wherein the first bare die filter and the second component each intersect a common first plane in a second direction orthogonal to the first direction;

wherein the first bare die filter is between the first surface of the package substrate and the second component in the second direction.

13. The method of claim 12, further comprising:

placing a second surface of the first bare die filter adjacent to the first surface of the package substrate; and placing the second component adjacent to a third surface of the first bare die filter opposite of the second surface.

14. The method of claim 13, further comprising forming a plurality of extension metal interconnects coupled to the package substrate and extending in the second direction;

wherein electrically coupling the second component to the first surface of the package substrate comprises coupling the second component to the plurality of extension metal interconnects.

15. The method of claim 14, further comprising a first redistribution layer (RDL) coupled to a first extension metal interconnect of the plurality of extension metal interconnects and the second component.

16. The method of claim 15, further comprising:

disposing a first overmold layer on the first bare die filter and the plurality of extension metal interconnects; and grinding down the first overmold layer to the third surface of the first bare die filter;

wherein forming the RDL further comprises forming the RDL adjacent to the third surface of the first bare die filter.

17. The method of claim 16, further comprising forming a second overmold layer adjacent a fifth surface of the second component.

18. The method of claim 13, wherein electrically coupling the first bare die filter to the first surface of the package substrate comprises coupling a plurality of first metal interconnects of the first bare die filter to the first surface of the package substrate such that a first air cavity is formed between a first filter die of the first bare die filter and the first surface of the package substrate.

* * * * *